US012785384B2

(12) United States Patent
Lee et al.

(10) Patent No.: US 12,785,384 B2
(45) Date of Patent: Nov. 3, 2026

(54) DISPLAY DEVICE AND MOBILE ELECTRONIC DEVICE INCLUDING THE SAME

(71) Applicant: SAMSUNG DISPLAY CO., LTD., Yongin-si (KR)

(72) Inventors: Seung Bin Lee, Yongin-si (KR); Kwang Sik Lee, Yongin-si (KR); Do Hoon Kim, Yongin-si (KR); Dong Suk Lee, Yongin-si (KR); Sung Il Jung, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 206 days.

(21) Appl. No.: 18/676,917

(22) Filed: May 29, 2024

(65) Prior Publication Data

US 2025/0141221 A1 May 1, 2025

(30) Foreign Application Priority Data

Oct. 31, 2023 (KR) ........................ 10-2023-0147355

(51) Int. Cl.

| | |
|---|---|
| ***H02H 9/04*** | (2006.01) |
| ***H10K 59/131*** | (2023.01) |
| *G06F 3/041* | (2006.01) |
| *G06F 3/044* | (2006.01) |
| *G09G 3/3225* | (2016.01) |

(52) U.S. Cl.

CPC ........... *H02H 9/046* (2013.01); *H10K 59/131* (2023.02); *G06F 3/04164* (2019.05); *G06F 3/0446* (2019.05); *G06F 2203/04111* (2013.01); *G09G 3/3225* (2013.01); *G09G 2330/04* (2013.01)

(58) Field of Classification Search

CPC .......... H02H 9/04; H02H 9/043; G06F 3/041; G06F 3/044; G06F 3/0446; G09G 3/3225; G09G 2330/04; G09G 3/006; H10K 59/131; H05K 9/0064

USPC ............................................................ 361/56

See application file for complete search history.

(56) References Cited

U.S. PATENT DOCUMENTS

2018/0054054 A1* 2/2018 Singor ................. H10D 89/611
2020/0343270 A1* 10/2020 Huang ................... H10D 86/60
2020/0402447 A1* 12/2020 An ....................... H10D 89/911

FOREIGN PATENT DOCUMENTS

KR 10-1870995 B1 6/2018

* cited by examiner

*Primary Examiner* — Danny Nguyen

(74) *Attorney, Agent, or Firm* — F. CHAU & ASSOCIATES, LLC

(57) ABSTRACT

Provided is a display device comprising a display panel including a display area and a non-display area and an electrostatic protection circuit disposed in the non-display area. The electrostatic protection circuit includes a first stage circuit including a (1-1)-th diode which causes a forward current to flow from a first node to a second node and a first capacitor and a first resistor connected in parallel to the (1-1)-th diode, a second stage circuit including a (2-1)-th diode which causes a forward current to flow from the second node to a third node and a second capacitor and a second resistor connected in parallel to the (2-1)-th diode, and a third stage circuit including a (3-1)-th diode which causes a forward current to flow from the third node to a fourth node and a third capacitor and a third resistor connected in parallel to the (3-1)-th diode.

20 Claims, 14 Drawing Sheets

DISPLAY DEVICE AND MOBILE ELECTRONIC DEVICE INCLUDING THE SAME

This application claims the benefit of Korean Patent Application No. 10-2023-0147355, filed on Oct. 31, 2023, in the Korean Intellectual Property Office, the disclosure of which is incorporated by reference herein in its entirety.

BACKGROUND

1. Field of Disclosure

The present disclosure generally relates to a display device and a mobile electronic device including the same. More particularly, the present disclosure relates to a display device capable of protecting the inside of a display panel from the static electricity of a ground line and easily discharging static electricity generated inside the display panel to a substrate, and a mobile electronic device including the same.

2. Description of the Related Art

The need for display devices to show images in many formats is growing as the information society progresses. Flat panel displays like liquid crystal, field emission, and light emitting displays could be used as the display devices. The displays that emit light may be either organic displays that use organic light emitting diode elements as light emitting elements or inorganic displays that use light emitting diodes or other light emitting diode elements as light emitting elements.

The deposition of an organic material on a substrate is a step in the manufacturing process of a display panel or display device. A deposition mask is employed during this process. An electrostatic chuck fixes the substrate and aligns it with the deposition mask during the deposition process. Using electrostatic force, the electrostatic chuck secures and supports the substrate. Apart from providing stability and adhesion to the substrate, the electrostatic chuck facilitates the discharge of static electricity that arises from the interaction between the substrate and the deposition mask.

However, if the substrate and the electrostatic chuck fail to properly contact each other, static electricity may be re-charged in a ground line of the substrate. The recharged static electricity may be input to each of a plurality of display panels included in the substrate, causing a defect in the display panel.

SUMMARY

Aspects of the present disclosure provide a display device which can protect the inside of a display panel from the static electricity of a ground line disposed on the periphery of a mother substrate and can easily discharge static electricity generated inside the display panel to the periphery of the mother substrate, and a mobile electronic device including the display device.

According to an embodiment of the disclosure, a display device may include a display panel which includes a display area and a non-display area and includes an electrostatic protection circuit disposed in the non-display area. The electrostatic protection circuit may include a first stage circuit including a (1-1)-th diode which causes a forward current to flow from a first node to a second node to which a first floating line is connected and a first capacitor and a first resistor connected in parallel to the (1-1)-th diode, a second stage circuit including a (2-1)-th diode which causes a forward current to flow from the second node to a third node to which a second floating line is connected and a second capacitor and a second resistor connected in parallel to the (2-1)-th diode, and a third stage circuit including a (3-1)-th diode which causes a forward current to flow from the third node to a fourth node and a third capacitor and a third resistor connected in parallel to the (3-1)-th diode.

The first node may be connected to a main ground line of a mother substrate which is provided for manufacturing the display panel.

Each of the (1-1)-th diode, the (2-1)-th diode, and the (3-1)-th diode may include a thin-film transistor.

Static electricity input to the first node experiences a voltage drop as the static electricity sequentially passes through the first, second, and third stage circuits, and then is discharged through the fourth node.

The first stage circuit may further include a (1-2)-th diode which causes a forward current to flow from the second node to the first node, the second stage circuit may further include a (2-2)-th diode which causes a forward current to flow from the third node to the second node, and the third stage circuit may further include a (3-2)-th diode which causes a forward current to flow from the fourth node to the third node. The first capacitor and the first resistor may be connected in parallel to the (1-2)-th diode, the second capacitor and the second resistor may be connected in parallel to the (2-2)-th diode, and the third capacitor and the third resistor may be connected in parallel to the (3-2)-th diode.

Each of the (1-2)-th diode, the (2-2)-th diode, and the (3-2)-th diode may include a thin-film transistor.

Static electricity input to the fourth node experiences a voltage drop as the static electricity sequentially passes through the third, second, first stage circuits, and then is discharged through the first node.

The fourth node may be connected to a common ground line which is commonly connected to a plurality of pads in the non-display area.

The pads may include display pad units connected to a circuit board through the common ground line.

The pads may include test pad units for a lighting test of the display area.

According to an embodiment of the disclosure, a mobile electronic device may include a display panel which includes a display area and a non-display area and includes an electrostatic protection circuit disposed in the non-display area. The electrostatic protection circuit may include a first stage circuit including a (1-1)-th diode which causes a forward current to flow from a first node to a second node to which a first floating line is connected and a first capacitor and a first resistor connected in parallel to the (1-1)-th diode, a second stage circuit including a (2-1)-th diode which causes a forward current to flow from the second node to a third node to which a second floating line is connected and a second capacitor and a second resistor connected in parallel to the (2-1)-th diode, and a third stage circuit including a (3-1)-th diode which causes a forward current to flow from the third node to a fourth node and a third capacitor and a third resistor connected in parallel to the (3-1)-th diode.

The first node may be connected to a main ground line of a mother substrate which is provided for manufacturing the display panel.

Each of the (1-1)-th diode, the (2-1)-th diode, and the (3-1)-th diode may include a thin-film transistor.

Static electricity input to the first node experiences a voltage drop as the static electricity sequentially passes through the first, second, third stage circuits, and then is discharged through the fourth node.

The first stage circuit may further include a (1-2)-th diode which causes a forward current to flow from the second node to the first node, the second stage circuit may further include a (2-2)-th diode which causes a forward current to flow from the third node to the second node, and the third stage circuit may further include a (3-2)-th diode which causes a forward current to flow from the fourth node to the third node, and the first capacitor and the first resistor may be connected in parallel to the (1-2)-th diode, the second capacitor and the second resistor may be connected in parallel to the (2-2)-th diode, and the third capacitor and the third resistor may be connected in parallel to the (3-2)-th diode.

Each of the (1-2)-th diode, the (2-2)-th diode, and the (3-2)-th diode may include a thin-film transistor.

Static electricity input to the fourth node experiences a voltage drop as the static electricity sequentially passes through the third, second, and first stage circuits, and then is discharged through the first node.

The fourth node may be connected to a common ground line which is commonly connected to a plurality of pads in the non-display area.

The pads may include display pad units connected to a circuit board and test pad units for a lighting test of the display area.

According to an embodiment of the disclosure, a display panel may include a display area and a non-display area, a display driver configured to generate data signals and voltages for driving the display panel, and an electrostatic protection circuit which is disposed in the non-display area of the display panel, wherein one end of the electrostatic protection circuit is connected to the display driver through a common ground line, and an other end of the electrostatic protection circuit is connected to a main ground line of a mother substrate which is provided for manufacturing the display panel. The electrostatic protection circuit may include a first stage circuit having a (1-1)-th diode which causes a forward current to flow from a first node to a second node to which a first floating line is connected and a first capacitor and a first resistor connected in parallel to the (1-1)-th diode, a second stage circuit having a (2-1)-th diode which causes a forward current to flow from the second node to a third node to which a second floating line is connected and a second capacitor and a second resistor connected in parallel to the (2-1)-th diode, and a third stage circuit having a (3-1)-th diode which causes a forward current to flow from the third node to a fourth node and a third capacitor and a third resistor connected in parallel to the (3-1)-th diode. The first node may be connected to the main ground line, and the fourth node may be connected to the common ground line.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

The present disclosure will now be described more fully hereinafter with reference to the accompanying drawings, in which preferred embodiments of the disclosure are shown. This disclosure may, however, be embodied in different forms and should not be construed as limited to the embodiments set forth herein. Rather, these embodiments are provided so that this disclosure will be thorough and complete, and will filly convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Features of each of various embodiments of the present disclosure may be partially or entirely combined with each other and may technically variously interwork with each other, and respective embodiments may be implemented independently of each other or may be implemented together in association with each other.

Hereinafter, specific embodiments will be described with reference to the accompanying drawings.

Figure 1:
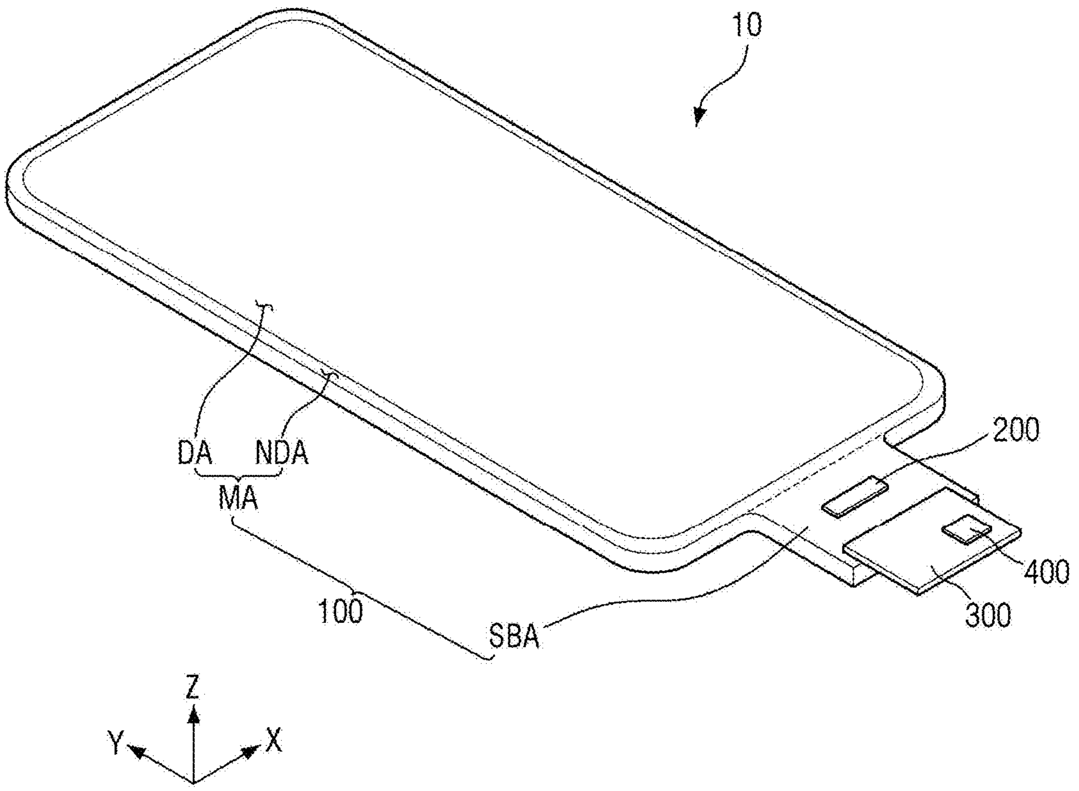
FIG. 1 is a schematic perspective view of a display device according to an embodiment.
Figure 2:
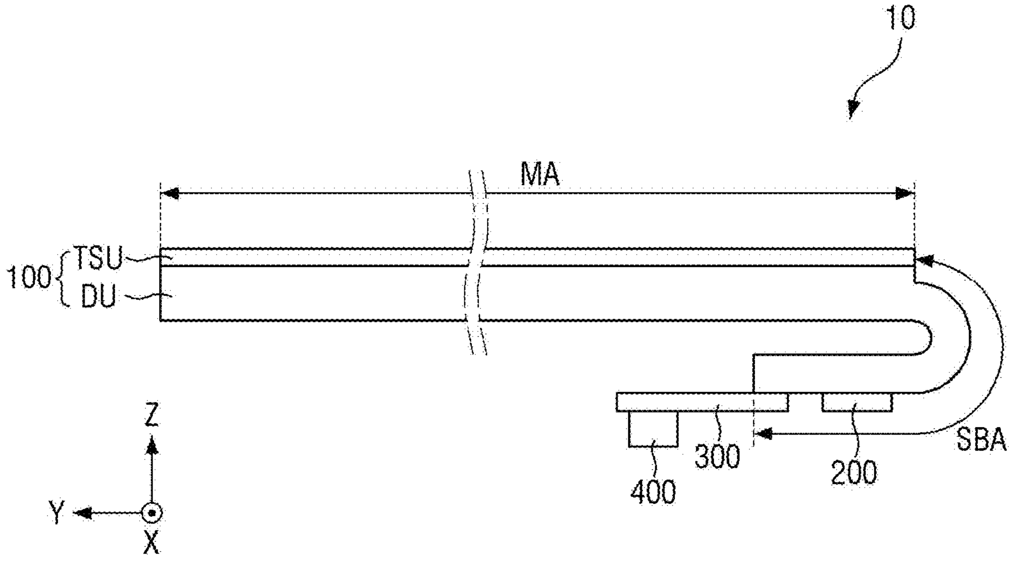
FIG. 2 is a schematic cross-sectional view of the display device according to the embodiment.

FIG. 1 is a schematic perspective view of a display device 10 according to an embodiment. FIG. 2 is a schematic cross-sectional view of the display device 10 according to the embodiment.

In the drawings, a first direction (x-direction) refers to a direction parallel to a side of the display device 10, for example, a short-side direction of the display device 10 when viewed from a top. A second direction (y-direction) refers to a direction parallel to the other side in contact with the above side of the display device 10, for example, a long-side direction of the display device 10 when viewed from a top. A third direction (z-direction) refers to a thickness direction of the display device 10. However, directions mentioned in embodiments should be understood as relative directions, and the embodiments are not limited to the mentioned directions.

Examples of the display device 10 may include various electronic devices that provide a display screen. For example, the display device 10 may be applied to portable electronic devices such as mobile phones, smartphones, tablet personal computers (PCs), mobile communication terminals, electronic notebooks, electronic books, portable multimedia players (PMPs), navigation devices, and ultra-mobile PCs (UMPCs). For example, the display device 10 may be applied as a display unit of a television, a notebook computer, a monitor, a billboard, or an Internet of things (IoT) device. In addition, the display device 10 may be applied to wearable devices such as smart watches, watch phones, glasses-type displays, and head mounted displays (HMDs).

Referring to FIG. 1, the display device 10 has a planar shape similar to a quadrangle. For example, the display device 10 has a planar shape similar to a quadrangle having short sides in the x-direction and long sides in the y-direction. In another example, the display device may have a planar shape similar to a square so that all of the four sides may have substantially equal lengths. Each corner where a short side extending in the x-direction meets a long side extending in the y-direction is rounded with a predetermined curvature or is right-angled. The planar shape of the display device 10 is not limited to the quadrangular shape but may also be similar to other polygonal shapes, a circular shape, or an oval shape.

At least one of front and back surfaces of the display device 10 is a display surface. Here, "front" refers to a surface located on one side of a plane, that is, a surface located in the z-direction in the drawings, and "back" refers to a surface located on the other side of the plane, that is, a surface located in a direction opposite to the z-direction in the drawings. In another example, the display device 10 may also be a double-sided display device 10 that displays images on both the front and back surfaces. However, the following description will focus on an embodiment in which the display surface is located on the front of the display device 10.

As depicted in FIG. 1, the display device 10 includes a display panel 100 that provides a display screen, a display driver 200, a circuit board 300, and a touch driver 400. The touch driver 400 is configured to detect a user's touch input and may also be referred to as a "touch sensing device."

The display panel 100 may have a planar shape similar to a quadrangle. For example, the display panel 100 has a planar shape similar to a quadrangle having short sides in the x-direction and long sides in the y-direction. Each corner where a short side extending in the x-direction meets a long side extending in the y-direction may be rounded with a predetermined curvature or may be right-angled. The planar shape of the display panel 100 is not limited to the quadrangular shape but may also be similar to other polygonal shapes, a circular shape, or an oval shape. In addition, the display panel 100 may be formed to be flexible so that it can be bent or curved.

The display panel 100 may include a main area MA and a sub-area SBA which is spaced apart from the main area MA.

The main area MA may include a display area DA having pixels that display an image and a non-display area NDA surrounding the display area DA. The display area DA may emit light from a plurality of emission areas or a plurality of opening areas. For example, the display panel 100 may include pixel circuits including switching elements, a pixel defining layer defining the emission areas or the opening areas, and self-light emitting elements.

The non-display area NDA may be disposed outside the display area DA. In this case, the non-display area NDA surrounds the display area DA. The non-display area NDA may be defined as an edge area of the main area MA of the display panel 100. The non-display area NDA may include a gate driver (not illustrated) which supplies gate signals to gate lines (not illustrated).

The sub-area SBA may protrude from one side of the main area MA. In this case, the sub-area SBA protrudes from a bottom portion of the main area MA along the second direction. The sub-area SBA may be bent such that it is overlapped by the main area MA in the z-direction. The sub-area SBA may include the display driver 200, a pad unit connected to the circuit board 300, and the touch driver 400 disposed on the circuit board 300.

Referring to FIG. 2, the display panel 100 includes a display unit DU and a touch unit TSU.

Figure 3:
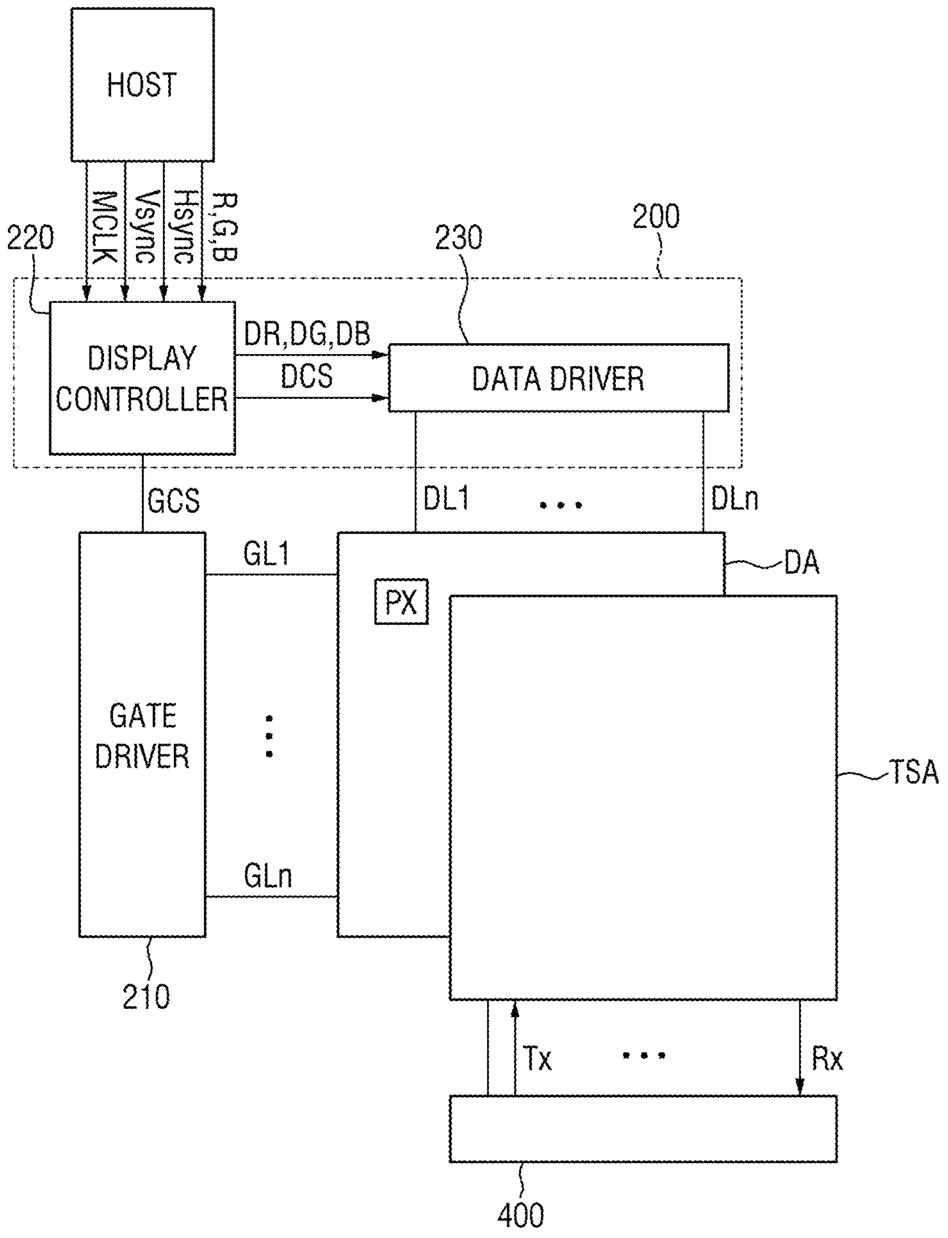
FIG. 3 is a conceptual diagram of a display unit and a touch driver according to an embodiment.

The display unit DU may include a plurality of pixels PX (see FIG. 3). Each of the pixels PX is a basic unit that displays a screen. Each of the plurality of pixels PX may include a red subpixel, a green subpixel, and a blue subpixel, but the present disclosure is not limited thereto. The plurality of pixels PX may be arranged when viewed from a top. For example, the plurality of pixels PX may be arranged in a matrix form, but the present disclosure is not limited thereto.

The touch unit TSU may be disposed on the display unit DU, but the present disclosure is not limited thereto. For example, the touch unit TSU may be formed like the display unit DU using an in-cell touch method. The touch unit TSU may include a plurality of touch electrodes RE and TE (see FIG. 5) to detect a user's touch in a capacitive manner and a plurality of touch driving lines TL (see FIG. 5) and a plurality of touch sensing lines RL (see FIG. 5) connecting the touch electrodes RE and TE (see FIG. 5) to the touch driver 400. The touch unit TSU detects an input (i.e., touch input) and may perform the function of a touch member. The touch unit TSU may determine whether a touch input has occurred and calculate a corresponding location as touch input coordinates. The display unit DU and the touch unit TSU are described in detail later with reference to FIGS. 4 through 7.

The display unit DU and the touch unit TSU may overlap each other in the z-direction. For example, the display area DA may display a screen and detect a touch input.

The sub-area SBA of the display panel 100 may extend from a side of the main area MA. In this case, the sub-area SBA of the display panel 100 extends from a bottom side of the main area MA. The sub-area SBA may include a flexible material that can be bent, folded, rolled, etc. For example, as depicted in FIG. 2, a portion of the sub-area SBA is bendable on one side of the main area MA so that the other portion of the sub-area SBA is overlapped the main area MA along the z-direction). The sub-area SBA may be disposed under the display panel 100 when the sub-area SBA is bent. Furthermore, the display driver 200, the circuit board 300, and the touch driver 400 may also be disposed under the display panel 100. In this case, the display driver 200, the circuit board 300, and the touch driver 400 may overlap the main area MA of the display panel in the z-direction.

Referring to FIG. 1, the display driver 200 is disposed in the sub-area SBA of the display panel 100. However, in another example, the display driver 200 may be formed as an integrated circuit and mounted on the display panel 100 using a chip on plastic (COP) method or a chip on glass (COG) method.

The display driver 200 may generate data signals and voltages to drive the display panel 100. In addition, the display driver 200 may supply data voltages to data lines (not illustrated) of the display panel 100. Furthermore, the display driver 200 may supply a power supply voltage to a power line and supply gate control signals to the gate driver.

The circuit board 300 may be disposed in the sub-area SBA of the display panel 100. Lead lines (not illustrated herein) of the circuit board 300 may be electrically connected to the pad unit of the display panel 100. The circuit board 300 may be a flexible printed circuit board, a printed circuit board, or a flexible film such as a chip on film. However, it is not limited therein. Thus, the circuit board 300 may be any type of circuit board.

The circuit board 300 may include a plurality of conductive lines (not illustrated) to transmit signals from a main circuit board (not illustrated) to the display driver 200 or to electrically connect the touch driver 400 to a plurality of driving electrodes TE and sensing electrodes RE of the touch unit TSU, respectively.

The touch driver 400 may be disposed in the sub-area SBA of the display panel 100. Alternatively, the touch driver 400 may be mounted on the circuit board 300.

The touch driver 400 may determine whether a touch input has occurred and calculate touch coordinates (i.e., locations) by detecting a change in capacitance between a plurality of touch electrodes. In another example, the touch driver 400 may be formed as an integrated circuit and mounted on the display panel 100 using a COP method or a COG method.

Figure 4:
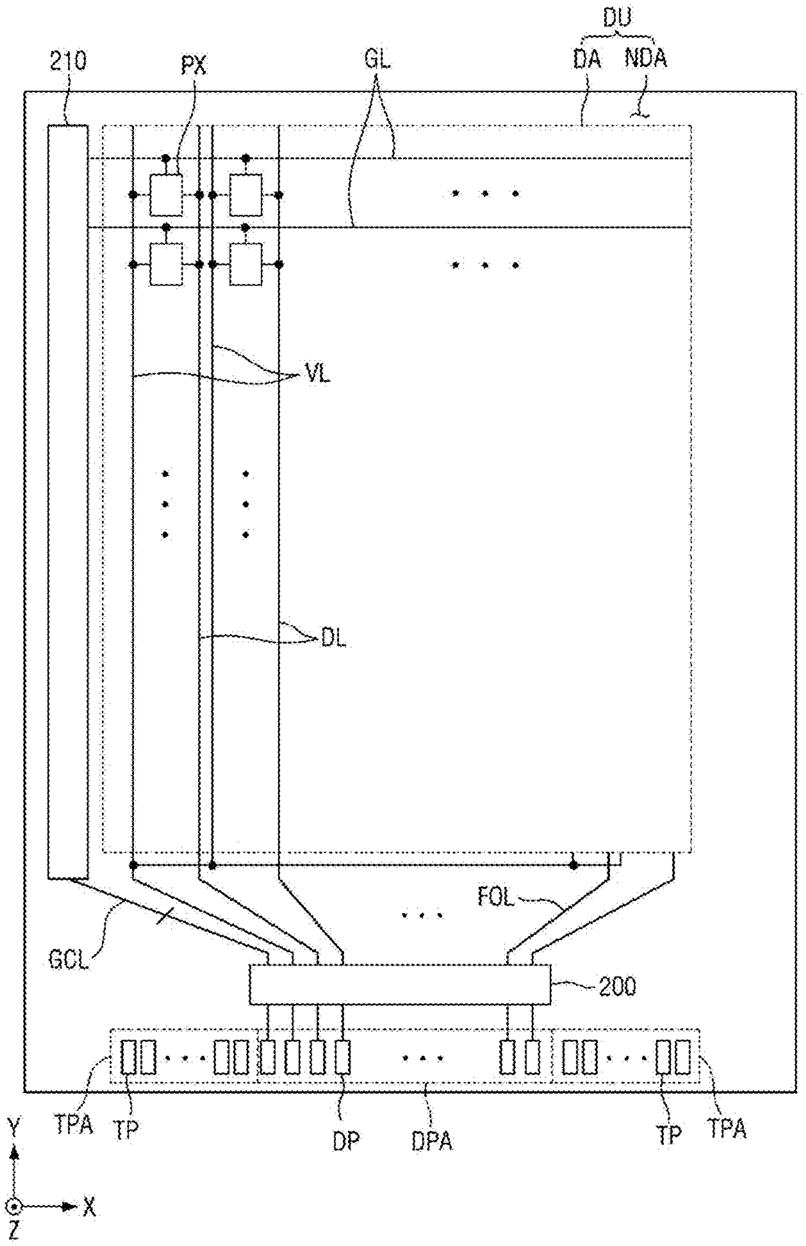
FIG. 4 is a schematic plan view of the display unit of the display device according to the embodiment.

FIG. 3 is a conceptual diagram of a display unit DU and a touch driver 400 according to an embodiment. FIG. 4 is a schematic plan view of the display unit DU of the display device 10 according to the embodiment.

As depicted to FIGS. 3 and 4, the display device 10 includes the display panel 100 including a plurality of pixels PX, the display driver 200, and the touch driver 400.

The display driver 200 may include a data driver 230 and a display controller 220.

The display controller 220 may receive input data R, G, B and timing control signals from an external source (e.g., a host). The timing control signals may include a vertical synchronization signal Vsync indicating one frame period, a horizontal synchronization signal Hsync indicating one horizontal period, and a main clock MCLK which is repeated at predetermined cycles. The input data R, G, B may be RGB data including red image data, green image data, and blue image data. The display controller 220 may generate output data signals DR, DG, DB and internal control signals using the received input data R, G, B and timing control signals. The internal control signals may include a data driver control signal DCS and a gate driver control signal GCS. The data driver control signal DCS may be transmitted to the data driver DCS, and the gate driver control signal GCS may be transmitted to a gate driver 210.

In this example, the display controller 220 may control the operation of the data driver 230 by providing the data driver control signal DCS to the data driver 230. The display controller 220 may control the operation of a gate driver 210 by providing the gate driver control signal GCS to the gate driver 210.

The data driver 230 may receive the output data signals DR, DG, DB and the data driver control signal DCS from the display controller 220 to generate data signals using the received output data signals DR, DG, DB and data driver control signal DCS. The data driver 230 may provide the generated data signals to each of the plurality of pixels PX of the display panel 100 through a plurality of data lines DL1 . . . DLn (see FIG. 4) formed in the display panel 100.

The gate driver 210 may receive the gate driver control signal GCS from the display controller 220 and generate gate signals using the received gate driver control signal GCS. The gate driver 210 may provide the generated gate signals to each of the plurality of pixels PX through a plurality of gate lines GL1 . . . GLn (see FIG. 4) formed in the display panel 100. The data lines DL (see FIG. 4) and the gate lines GL (see FIG. 4) are described in detail later with reference to FIG. 4.

In FIG. 3, the display driver 200 does not include the gate driver 210. However, in another example, the gate driver 210 may also be included in the display driver 200 which controls the operation of the display panel 100. Therefore, the gate driver 210, the data driver 230, and the display controller 220 may be formed as integrated circuits. The gate driver 210 may be formed during a TFT process of the display panel 100. Also, in another example, the display controller 220 and the data driver 230 may be merged together to form a timing controller embedded driver integrated circuit (TED).

The display panel 100 may include a plurality of pixels PX connected to each of the plurality of the data lines DL (see FIG. 4) and each of the plurality of the gate lines GL (see FIG. 4).

A frame frequency at which the display driver 200 drives the display panel 100 may vary. For example, the frame frequency may variably drive the display panel 100 from 1 Hz to 240 Hz according to user's selection. The display driver 200 may drive the display panel 100 at 60 Hz during one section and change the frame frequency to 120 Hz during another section according to the user's selection.

Figure 5:
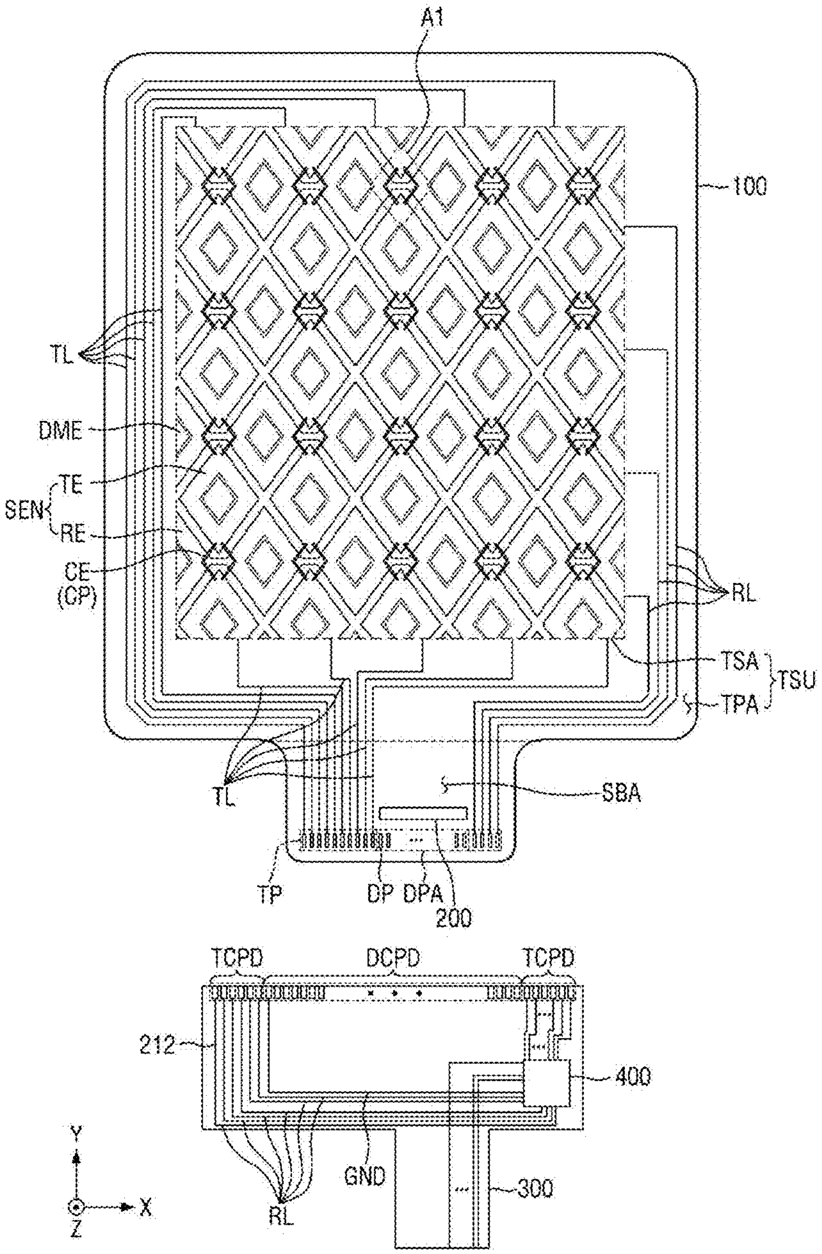
FIG. 5 is a plan view of a touch unit of the display device according to the embodiment.

A touch area TSA may include a plurality of touch electrodes TE (see FIG. 5), a plurality of sensing electrodes RE (see FIG. 5), a plurality of touch driving lines TL (see FIG. 5), and a plurality of touch sensing lines RL (see FIG. 5). The touch area TSA may detect a touch input from a user by receiving electrical signals from the touch driver 400 disposed on the circuit board 300 through the touch driving lines TL or transmitting electrical signals detected from the sensing electrodes RE to the touch driver 400 through the touch sensing lines RL. Specifically, the touch driver 400 may detect a touch input by converting analog electrical signals detected in the touch area TSA into digital signals. The touch driver 400 is described in detail later with reference to FIG. 5.

Referring to FIG. 4, the display unit DU may include a display area DA and a non-display area NDA. The display unit DU may include a plurality of pixels PX and a plurality of gate lines GL and a plurality of data lines DL connected to the pixels PX.

The gate lines GL may supply gate signals received from the gate driver 210 to each of the plurality of pixels PX. The gate lines GL may extend in the x-direction and may be spaced apart from each other in the y-direction crossing the x-direction.

The data lines DL may supply the output data signals DR, DG, DB and data signals DCS received from the display driver 200 to each of the plurality of subpixels pixels PX. The data lines DL may extend in the y-direction and may be spaced apart from each other in the x-direction.

As depicted in FIG. 4, the non-display area NDA surrounds the display area DA. The gate driver 210 may be disposed on left side of the display area DA, and the display driver 200 may be disposed on the bottom portion of the display area DA. However, it is not limited therein. Thus, in another example, the gate driver 210 may be disposed on right side of the display area DA, and the display driver 200 may be disposed on the top portion of the display area DA. In this case, the non-display area NDA may include the gate driver 210 transmitting gate signals to the gate lines GL, a plurality of fan-out lines FOL connecting the data lines DL and the display driver 200, and a plurality of display pad units DP connected to the circuit board 300.

The display driver 200 may supply the gate driver control signal GCS to the gate driver 210 through a plurality of gate control lines GCL. In this case, the plurality of the gate control lines GCL may connect the display driver 200 to the gate driver 210. The gate driver 210 may generate a plurality of gate signals based on the gate driver control signal GCS and sequentially supply the gate signals to each of the plurality of the gate lines GL in a set order.

The display driver 200 may supply a first power supply voltage to a plurality of first power lines VL and a second power supply voltage to a plurality of second power lines (not illustrated) through the data driver 230. Each of the plurality of pixels PX may receive the first power voltage through a first power line VL and the second power supply voltage through a second power line. The first power supply voltage may be a predetermined high-level voltage, and the second power supply voltage may be lower than the first power supply voltage.

A display pad area DPA and a touch peripheral area TPA may be disposed at an edge of the display panel 100. As shown in FIG. 4, the display pad area DPA and the touch peripheral area TPA are disposed below the display driver 200 in the y-direction. However, in another example, the display pad area DPA and the touch peripheral area TPA may be disposed anywhere in the non-display area NDA. The display pad area DPA may include a plurality of display pad units DP. The display pad units DP may be connected to a main processor (not illustrated) through the circuit board 300. The display pad units DP may be connected to the circuit board 300 to receive digital video data and may supply the digital video data to the display driver 200. In addition, the non-display area NDA may include a plurality of touch pad units TP disposed adjacent to the display pad units DP along the x-direction.

FIG. 5 is a plan view of the touch unit TSU of the display device 10 according to the embodiment.

Referring to FIG. 5, the touch unit TSU includes a touch area TSA that detects a user's touch and a touch peripheral area TPA disposed around the touch area TSA. The touch area TSA may overlap the display area DA of the display panel 100 along the z-direction, and the touch peripheral area TPA may overlap the non-display area NDA of the display panel 100 along the z-direction.

The touch unit TSU may include a plurality of driving electrodes TE, a plurality of sensing electrodes RE, a plurality of touch driving lines TL, and a plurality of touch sensing lines RL.

The circuit board 300 may include a plurality of first circuit pad units DCPD connected to the display pad units DP of the display panel 100, a plurality of second circuit pad units TCPD connected to touch pad units TP of the display panel 100, and a plurality of touch circuit lines 212 connecting the second circuit pad units TCPD and the touch driver 400 together. The driving electrodes TE and the sensing electrodes RE of the touch area TSA may be sensor electrodes SEN and electrically connected to the touch driver 400 through the circuit board 300. The touch area TSA receives electrical signals from the touch driver 400 disposed on the circuit board 300 through the touch driving lines TL and the touch sensing lines RL. In addition, the touch area TSA transmits electrical signals detected from the driving electrodes TE and the sensing electrodes RE to the touch driver 400 through the touch driving lines TL and the touch sensing line RL, respectively.

The driving electrodes TE may be arranged in the x-direction and the y-direction. The driving electrodes TE may be spaced apart from each other in the x-direction and the y-direction. Each of the driving electrodes TE may be electrically connected to the adjacent driving electrode TE through a bridge electrode CE (or connection member CP) in the y-direction.

Each of the plurality of the driving electrodes TE may be connected to each of the plurality of the touch pad units TP through the touch driving lines TL. Some of the touch driving lines TL may extend to the touch pad units TP via a lower side of the touch peripheral area TPA. Other touch driving lines TL may extend to the touch pad units TP via upper, left, and lower portions of the touch peripheral area TPA. However, in another example, the touch driving lines TL may extend to the touch pad units TP via right portion of the touch peripheral area TPA. The touch pad units TP may be connected to the touch driver 400 through the circuit board 300.

The display pad area DPA including display pad units DP and touch pad units TP may be disposed at an edge of the sub-area SBA of the display panel 100. The display pad units DP and the touch pad units TP may be electrically connected to the circuit board 300 using a low-resistance, high-reliability material such as an anisotropic conductive film.

The sensing electrodes RE may extend in the x-direction and may be spaced apart from each other in the y-direction. Thus, the sensing electrodes RE may be arranged in the x-direction and the y-direction. Each of the sensing electrodes RE may be electrically connected to the adjacent sensing electrode RE through a connection portion along the x-direction.

The sensing electrodes RE may be connected to the touch pad units TP through the touch sensing lines RL. For example, a plurality of sensing electrodes RE disposed on a right side of the touch area TSA may be connected to the touch pad units TP through the touch sensing lines RL. In this case, the touch sensing lines RL may extend to the touch pad units TP via the right and lower portions of the touch peripheral area TPA. However, in another example, the touch sensing lines RL may extend to the touch pad units TP via upper, right, and lower portions of the touch peripheral area TPA. The touch pad units TP may be connected to the touch driver 400 through the circuit board 300.

Each of the driving electrodes TE and the sensing electrodes RE may include a surface-like pattern made of a transparent conductive layer or include a mesh-like pattern made of an opaque metal along an area where a light emitting element is not disposed. Therefore, the driving electrodes TE and the sensing electrodes RE may not interfere with the propagation of light emitted from the display area DA.

A touch driving signal may be transmitted from the touch driver 400 to each of the driving electrodes TE through one of the touch driving lines TL. When the touch driving signal is transmitted to each of the driving electrodes TE, mutual capacitance may be formed between the driving electrode TE and an adjacent sensing electrode RE. When a touch input occurs, the value of the mutual capacitance between the driving electrode TE and the adjacent sensing electrode RE may change. The change in the value of the mutual capacitance between the driving electrode TE and the adjacent sensing electrode RE may be transmitted to the touch driver 400 through the touch sensing lines RL. Accordingly, the touch driver 400 may determine whether a touch input has occurred and calculate a corresponding coordinate (i.e., location) as touch input coordinates. Touch detection may be achieved through mutual capacitance, but the present disclosure is not limited thereto.

Reference character GND shown in FIG. 5 may indicate a ground line formed on the circuit board 300.

Reference character DME shown in FIG. 5 may indicate dummy electrodes. The driving electrodes TE, the sensing electrodes RE, and the dummy electrodes DME may be disposed on the same layer and may be spaced apart from each other.

Figure 6:
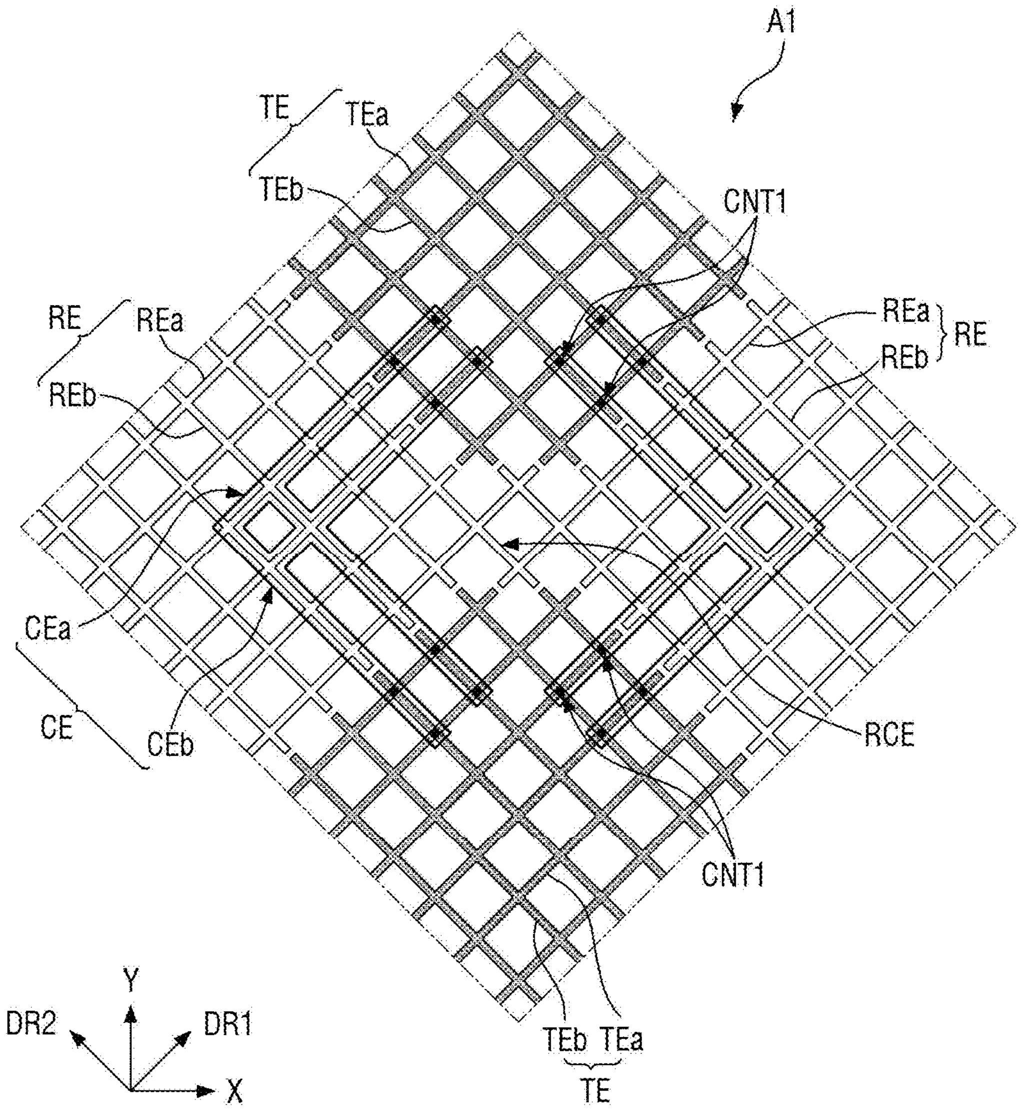
FIG. 6 is an enlarged view of area A1 in FIG. 5.
Figure 7:
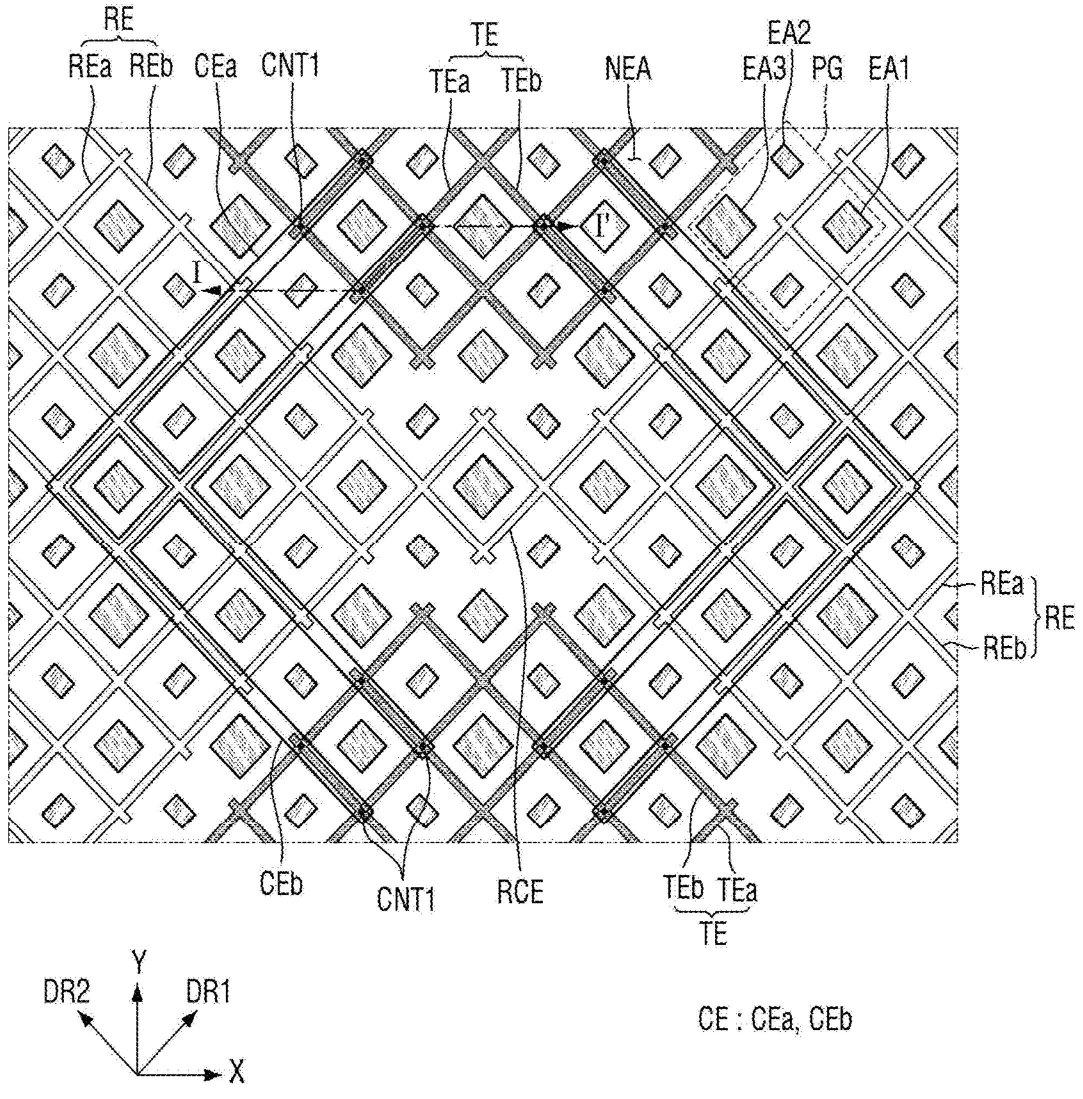
FIG. 7 is an enlarged view of a part of the display device according to the embodiment.

FIG. 6 is an enlarged view of area A1 in FIG. 5. FIG. 7 is an enlarged view of a part of the display device 10 according to the embodiment.

As depicted in FIGS. 6 and 7, a plurality of driving electrodes TE is arranged in the x-direction and the y-direction. In this case, the driving electrodes TE may be spaced apart from each other in the x-direction and the y-direction. Each of the driving electrodes TE may be electrically connected to the adjacent driving electrode TE through bridge electrodes CE.

A plurality of sensing electrodes RE may extend in the x-direction and may be spaced apart from each other in the y-. The sensing electrodes RE may be arranged in the x-direction and the y-direction. Each of the sensing electrodes RE may be electrically connected to the adjacent sensing electrode RE through a connection portion RCE in the x-direction. For example, the connection portion RCE of the sensing electrodes RE may cross between adjacent driving electrodes TE.

A plurality of bridge electrodes CE may be disposed on a different layer from the driving electrodes TE and the sensing electrodes RE. Each of the bridge electrodes CE may include a first portion CEa and a second portion CEb. For example, the second portion CE*b* of each bridge electrode CE may be connected to a driving electrode TE disposed on one side through first contact holes CNT1 and may extend in the other direction DR2. The first portion CE*a* of each bridge electrode CE may be bent from the second portion CE*b* in an area overlapping a sensing electrode RE and may extend in one direction DR1. The first portion CEa may be connected to a driving electrode TE disposed on the other side through first contact holes CNT1. The one direction DR1 may be a direction between the x-direction and the y-direction, and the other direction DR2 may be a direction crossing the one direction DR1. For example, each of the bridge electrodes CE may connect the driving electrodes TE adjacent to each other in the y-direction.

According to an embodiment, the driving electrodes TE, the sensing electrodes RE, and the dummy electrodes DME (see FIG. 5) may be formed in a mesh structure or a net structure when viewed from a plan. The driving electrodes TE, the sensing electrodes RE, and the dummy electrodes DME (see FIG. 5) may not overlap first through third emission areas EA1 through EA3 of the pixels PX. The bridge electrodes CE may not overlap the first through third emission areas EA1 through EA3. Therefore, the display device 10 can prevent the luminance of light emitted from the first through third emission areas EA1 through EA3 from being reduced by the touch unit TSU.

Each of the driving electrodes TE may include a first portion TE*a* extending in one direction DR1 and a second portion TE*b* extending in the other direction DR2 which may be perpendicular to one direction DR1. Each of the sensing electrodes RE may include a first portion RE*a* extending in one direction DR1 and a second portion RE*b* extending in the other direction DR2.

According to an embodiment, the driving electrodes TE, the sensing electrodes RE, and the dummy electrodes DME (see FIG. 5) may be formed in a full-surface structure rather than a mesh structure or a net structure when viewed from a plan. In this case, the driving electrodes TE, the sensing electrodes RE, and the dummy electrodes DME (see FIG. 5) may include a transparent conductive material with high light transmittance, such as indium tin oxide (ITO) or indium zinc oxide (IZO). However, it is not limited thereto.

Each of the pixels PX may include first through third subpixels, and the first through third subpixels may include the first through third emission areas EA1 through EA3, respectively. For example, the first emission area EA1 may emit light of a first color or red light, the second emission area EA2 may emit light of a second color or green light, and the third emission area EA3 may emit light of a third color or blue light, but the present disclosure is not limited thereto. In another example, the first emission area EA1 may emit light of green color, the second emission area EA2 may emit light of blue color, and the third emission area EA3 may emit light of red light. In still another example, the first emission area EA1 may emit light of blue color, the second emission area EA2 may emit light of red color, and the third emission area EA3 may emit light of green light.

Each of the pixels PX may include one first emission area EA1, two second emission areas EA2, and one third emission area EA3 to express a white gray level. Therefore, light emitted from one first emission area EA1, light emitted from two second emission areas EA2, and light emitted from one third emission area EA3 may combine to express a white gray level. However, in another example, the number of first emission area EA1, the second emission area EA2, and the third emission area EA3 included in each of the pixels PX may be different from the present disclosure.

Figure 8:
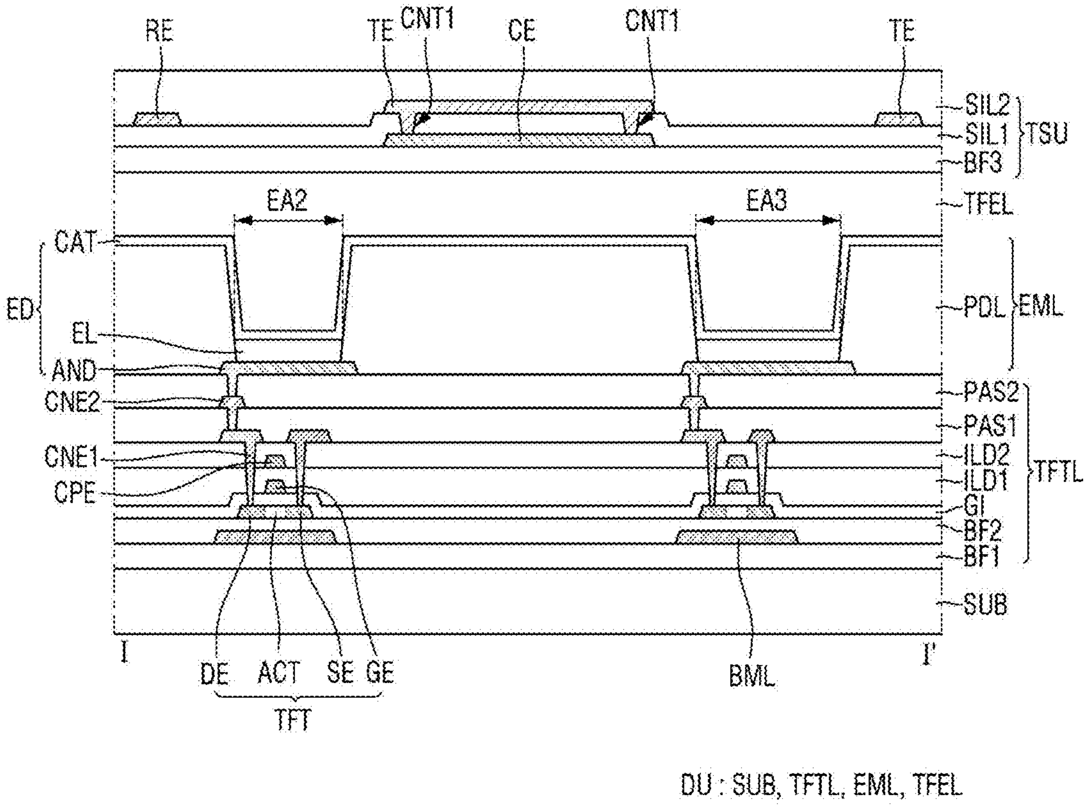
FIG. 8 is a cross-sectional view of the display device according to the embodiment, taken along line I-I' of FIG. 7.

FIG. 8 is a cross-sectional view taken along line I-I' of FIG. 7.

Referring to FIG. 8, the display panel 100 includes the display unit DU and the touch unit TSU. The display unit DU may include a substrate SUB, a thin-film transistor layer TFTL disposed on the substrate SUB, a light emitting element layer EML disposed on the thin-film transistor layer TFTL, and an encapsulation layer TFEL disposed on the light emitting element layer EML.

The substrate SUB may support the display panel 100. The substrate SUB may be made of an insulating material such as polymer resin. For example, the substrate SUB may be a flexible substrate that can be bent, folded, rolled, etc. For another example, the substrate SUB may include a flexible material and a rigid material.

The thin-film transistor layer TFTL may include first and second buffer layers BF1 and BF2, light blocking layers BML, thin-film transistors TFT, a gate insulating layer GI, a first interlayer insulating layer ILD1, capacitor electrodes CPE, a second interlayer insulating layer ILD2, first connection electrodes CNE1, a first passivation layer PAS1, second connection electrodes CNE2, and a second passivation layer PAS2.

The first buffer layer BF1 may be disposed on the substrate SUB. The first buffer layer BF1 may include an inorganic layer that can prevent the penetration of air or moisture. For example, the first buffer layer BF1 may include a plurality of inorganic layers stacked alternately.

Each of the light blocking layers BML may be disposed on the first buffer layer BF1. For example, each of the light blocking layers BML may be a single layer or a multilayer made of any one or more of molybdenum (Mo), aluminum (Al), chromium (Cr), gold (Au), titanium (Ti), nickel (Ni), neodymium (Nd), copper (Cu), and alloys thereof. For another example, each of the light blocking layers BML may be an organic layer including a black pigment.

The second buffer layer BF2 may be disposed on the first buffer layer BF1 to cover the light blocking layers BML. The second buffer layer BF2 may include an inorganic layer that can prevent the penetration of air or moisture. For example, the second buffer layer BF2 may include a plurality of inorganic layers stacked alternately.

The thin-film transistors TFT may be disposed on the second buffer layer BF2 and may constitute respective pixel circuits of a plurality of pixels. For example, each of the thin-film transistors TFT may be a driving transistor or a switching transistor of a pixel circuit. Each of the thin-film transistors TFT may include a semiconductor region ACT, a gate electrode GE, a source electrode SE, and a drain electrode DE. In this case, the drain electrode DE and the source electrode SE of the thin-film transistors TFT may be disposed adjacent to the semiconductor region ACT, and the gate electrode GE of the thin-film transistors TFT may be disposed on the semiconductor region ACT.

The semiconductor region ACT, the source electrode SE, and the drain electrode DE of the thin film transistors TFT may be disposed on the second buffer layer BF2. The semiconductor region ACT may be overlapped by the gate electrode GE in the thickness direction (i.e., z-direction) and may be insulated from the gate electrode GE by the gate insulating layer GI. The source electrode SE and the drain electrode DE may be formed on left and right sides of the semiconductor region ACT, respectively. The source electrode SE and the drain electrode DE may be formed by making the material of the semiconductor region ACT conductive.

The gate electrode GE may be disposed on the gate insulating layer GI. The gate electrode GE may overlap the semiconductor region ACT with respect to the gate insulating layer GI interposed therebetween.

The gate insulating layer GI may be disposed on the second buffer layer BF2 to cover the semiconductor regions ACT, the source electrodes SE, and the drain electrodes DE. For example, the gate insulating layer GI may cover the semiconductor regions ACT, the source electrodes SE, the drain electrodes DE, and the second buffer layer BF2 so that the gate insulating layer GI may insulate the semiconductor regions ACT from the gate electrodes GE. At least one contact hole through which the first connection electrode CNE1 passes is defined in the gate insulating layer GI of each of the thin-film transistors TFT.

The first interlayer insulating layer ILD1 may be disposed on the gate insulating layer GI to cover the gate electrode GE. At least one contact hole through which the first connection electrode CNE1 passes is defined in the first interlayer insulating layer ILD1. The contact hole of the first interlayer insulating layer ILD1 may be connected to the contact hole of the gate insulating layer GI.

The capacitor electrodes CPE may be disposed on the first interlayer insulating layer ILD1. The capacitor electrodes CPE may overlap the gate electrodes GE in the z-direction.

The second interlayer insulating layer ILD2 may be disposed on the first interlayer insulating layer ILD1 to cover the capacitor electrodes CPE. At least one contact hole through which the first connection electrode CNE1 passes is defined in the second interlayer insulating layer ILD2 of each of the thin-film transistors TFT. The contact hole of the second interlayer insulating layer ILD2 may be connected to the contact hole of the first interlayer insulating layer ILD1 and the contact hole of the gate insulating layer GI.

The first connection electrodes CNE1 may be disposed on the second interlayer insulating layer ILD2. At least one of the first connection electrodes CNE1 may electrically connect the drain electrode DE of the thin-film transistor TFT to the second connection electrode CNE2. The first connection electrodes CNE1 may be inserted into the contact holes formed in the second interlayer insulating layer ILD2, the first interlayer insulating layer ILD1 and the gate insulating layer GI to contact the drain electrodes DE of the thin-film transistors TFT. The other first connection electrode CNE1 may be connected to the source electrode SE.

The first passivation layer PAS1 may be disposed on the second interlayer insulating layer ILD2 to cover the first connection electrodes CNE1. The first passivation layer PAS1 may protect the thin-film transistors TFT. At least one contact hole through which the second connection electrode CNE2 passes is defined in the first passivation layer PAS1 of each of the thin-film transistors TFT.

The second connection electrode CNE2 may be disposed on the first passivation layer PAS1. The second connection electrode CNE2 may electrically connect a first connection electrode CNE1 to a first electrode AND of a light emitting element ED. The second connection electrode CNE2 may be inserted into the contact holes provided in the first passivation layer PAS1 to contact the first connection electrodes CNE1.

The second passivation layer PAS2 may be disposed on the first passivation layer PAS1 to cover the second connection electrodes CNE2. At least one contact hole through which first electrodes AND of light emitting element ED passes is defined in second passivation layer PAS2 of each of the thin-film transistors TFT.

The light emitting element layer EML may be disposed on the thin-film transistor layer TFTL. For example, the light emitting element layer EML may be disposed on the second passivation layer PAS2. The light emitting element layer EML may include the light emitting elements ED and a pixel defining layer PDL. Each of the light emitting elements ED may include the first electrode AND, a light emitting layer EL, and a second electrode CAT.

The first electrode AND may overlap one of the first through third emission areas EA1 through EA3 defined by the pixel defining layer PDL. In this example, as shown in FIG. 8, the first electrode AND overlaps the second and third emission areas EA2, EA3. The first electrode AND may be connected to the drain electrode DE of a thin-film transistor TFT through the first and second connection electrodes CNE1 and CNE2.

The light emitting layer EL may be disposed on the first electrode AND. For example, the light emitting layer EL may be, but is not limited to, an organic light emitting layer made of an organic material. When the light emitting layer EL is an organic light emitting layer, if a thin-film transistor TFT applies a predetermined voltage to the first electrode AND of a corresponding light emitting element ED and the second electrode CAT of the light emitting element ED receives a common voltage or a cathode voltage, holes and electrons may move to the organic light emitting layer EL through a hole transport layer and an electron transport layer, respectively. The holes and the electrons may be combined with each other in the organic light emitting layer EL to emit light.

The second electrode CAT may be disposed on the light emitting layer EL and the pixel defining layer PDL. For example, the second electrode CAT may be implemented in the form of an electrode that commonly covers all pixels rather than being separate for each pixel. For example, the second electrode CAT may be disposed on the light emitting layer EL in the first through third emission areas EA1, EA2, EA3 and disposed on the pixel defining layer PDL in an area other than the first through third emission areas EA1, EA2, EA3.

The pixel defining layer PDL may define the first through third emission areas EA1, EA2, EA3. The pixel defining layer PDL may separate and insulate the respective first electrodes AND of the light emitting elements ED from each other. For example, the pixel defining layer PDL is interposed between two adjacent emission areas. In FIG. 8, the second emission area EA2 and the third emission area EA3 are separated by the pixel defining layer PDL interposed therebetween.

The encapsulation layer TFEL may be disposed on the second electrode CAT to cover the light emitting elements ED. The encapsulation layer TFEL may include at least one inorganic layer to prevent the penetration of oxygen or moisture into the light emitting element layer EML. The encapsulation layer TFEL may include at least one organic layer to protect the light emitting element layer EML from foreign substances such as dust.

The touch unit TSU may be disposed on the encapsulation layer TFEL. The touch unit TSU may include a third buffer layer BF3, a bridge electrode CE, a first insulating layer SIL1, a driving electrode TE, a sensing electrode RE, and a second insulating layer SIL2.

The third buffer layer BF3 may be disposed on the encapsulation layer TFEL. The third buffer layer BF3 may function as insulation and optical functions. The third buffer layer BF3 may include at least one inorganic layer. However, in another example, the third buffer layer BF3 may be omitted. In this case, the first insulating layer SIL1 may be disposed on the encapsulation layer TFEL.

The bridge electrode CE may be disposed on the third buffer layer BF3. The bridge electrode CE may be disposed on a different layer from the driving electrode TE and the sensing electrode RE to connect driving electrodes TE adjacent to each other in the y-direction (See FIG. 7). For example, the bridge electrode CE may be a single layer of molybdenum (Mo), titanium (Ti), copper (Cu) or aluminum (Al) or may be a stacked structure (Ti/Al/Ti) of aluminum and titanium, a stacked structure (ITO/Al/ITO) of aluminum and indium tin oxide, an APC alloy, or a stacked structure (ITO/APC/ITO) of an APC alloy and indium tin oxide. The bridge electrode CE may not overlap the first through third emission areas EA1, EA2, EA3.

The first insulating layer SIL1 may be disposed on the third buffer layer BF3 to cover the bridge electrode CE. The first insulating layer SIL1 may function as insulation and optical functions. For example, the first insulating layer SIL1 may be an inorganic layer such as a silicon nitride layer, a silicon oxynitride layer, a silicon oxide layer, a titanium oxide layer, or an aluminum oxide layer.

The driving electrode TE and the sensing electrode RE may be disposed on the first insulating layer SIL1. Each of the driving electrode TE and the sensing electrode RE may not overlap the first through third emission areas EA1, EA2, EA3. The driving electrode TE may overlap the bridge electrode CE along a thickness direction (i.e., z-direction) Each of the driving electrode TE and the sensing electrode RE may be a single layer of molybdenum (Mo), titanium (Ti), copper (Cu) or aluminum (Al) or may be a stacked structure (Ti/Al/Ti) of aluminum and titanium, a stacked structure (ITO/Al/ITO) of aluminum and indium tin oxide, an APC alloy, or a stacked structure (ITO/APC/ITO) of an APC alloy and indium tin oxide.

The second insulating layer SIL2 may be disposed on the first insulating layer SIL1 to cover the driving electrode TE, the sensing electrode RE, and the first insulating layer SIL1. The second insulating layer SIL2 may function as insulation and optical functions. The second insulating layer SIL2 may be made of at least one of the materials exemplified in the description of the first insulating layer SIL1.

In FIG. 8, the bridge electrode CE is formed under the driving electrode TE and the sensing electrode RE, but the present disclosure is not limited thereto. For example, the bridge electrode CE may also be formed above the driving electrode TE and the sensing electrode RE. In this case, the bridge electrode CE may be formed on a different layer than the driving electrode TE and the sensing electrode RE.

Figure 9:
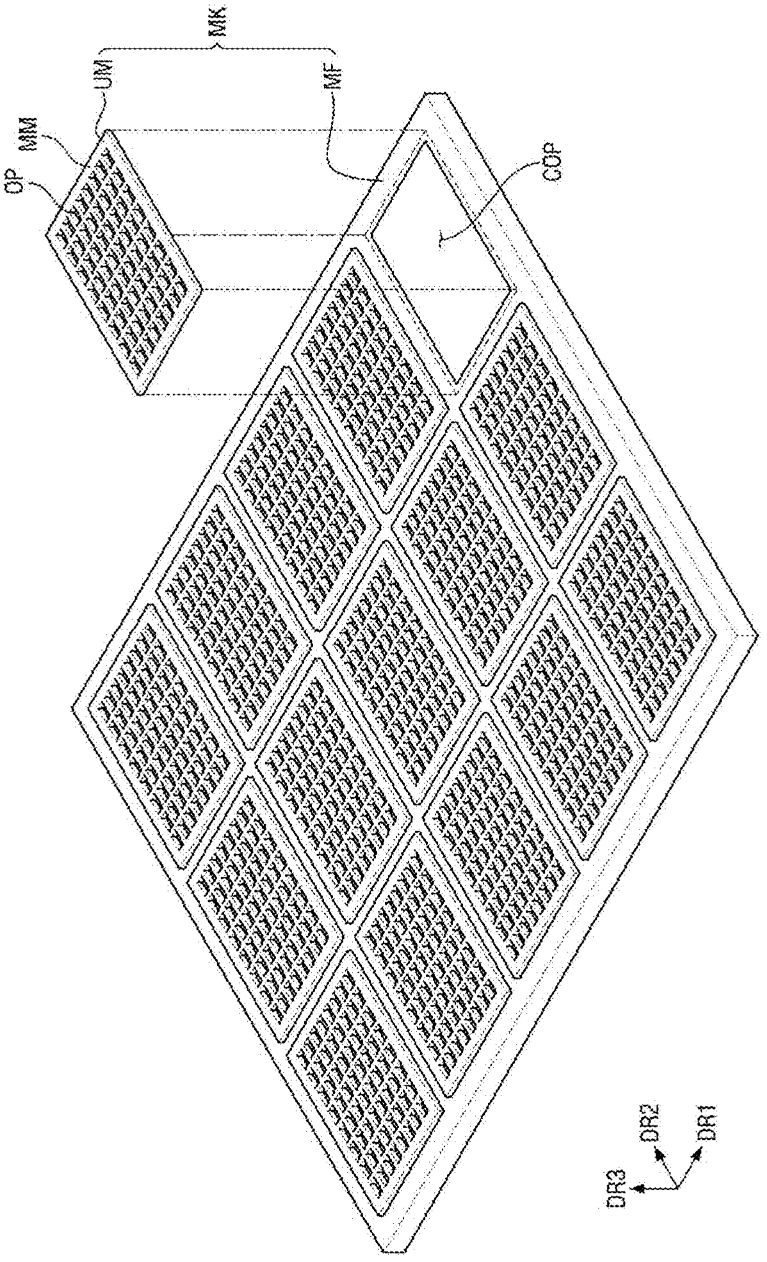
FIG. 9 is a perspective view of a deposition mask according to an embodiment.

FIG. 9 is a perspective view of a deposition mask MK according to an embodiment. The mask MK according to the embodiment illustrated in FIG. 9 may be used in a process of depositing at least a portion of the light emitting layer EL of the display panel 100 according to an embodiment.

Referring to FIG. 9, the mask MK according to the embodiment may be a shadow mask in which mask membranes MM are disposed on a mask substrate.

According to an embodiment, the mask MK may include a mask frame MF and a unit mask UM. The mask may further include the mask substrate, and the mask membranes MM may be disposed on the mask substrate. The mask membranes MM may be respectively disposed in cell areas arranged in a matrix form, and each cell area may be surrounded by a mask rib area. A portion of the mask substrate may be disposed in the mask rib area. The mask rib area may support the mask membranes MM.

The mask substrate may include a plurality of cell areas and a mask frame area excluding the cell areas. The mask frame area may include the mask rib area surrounding each cell area and an outer frame area disposed at outermost edges of the mask substrate. The mask frame MF may be disposed in the mask frame area. The mask frame MF may include mask ribs surrounding the cell areas.

The mask rib area may be an area that separates the cell areas. For example, the cell areas may be arranged in a matrix form, and the mask rib area may surround each of the cell areas.

The unit mask UM may include the mask membranes MM, and a plurality of openings OP is defined in the unit mask UM. A plurality of cell openings COP is defined by the mask frame MF. The cell opening COP and the unit mask UM masking at least a portion of the cell opening COP may be disposed in each of the cell areas of the mask substrate. For example, the unit mask UM may overlap each of the cell openings COP in a third direction DR3. One unit mask UM may be used in a deposition process of one display panel 100.

A plurality of cell openings COP may penetrate through the mask frame MF along the third direction DR3 (i.e., thickness direction) of the mask MK. The cell openings COP may be formed by partially etching the mask substrate from a back side.

Figure 10:
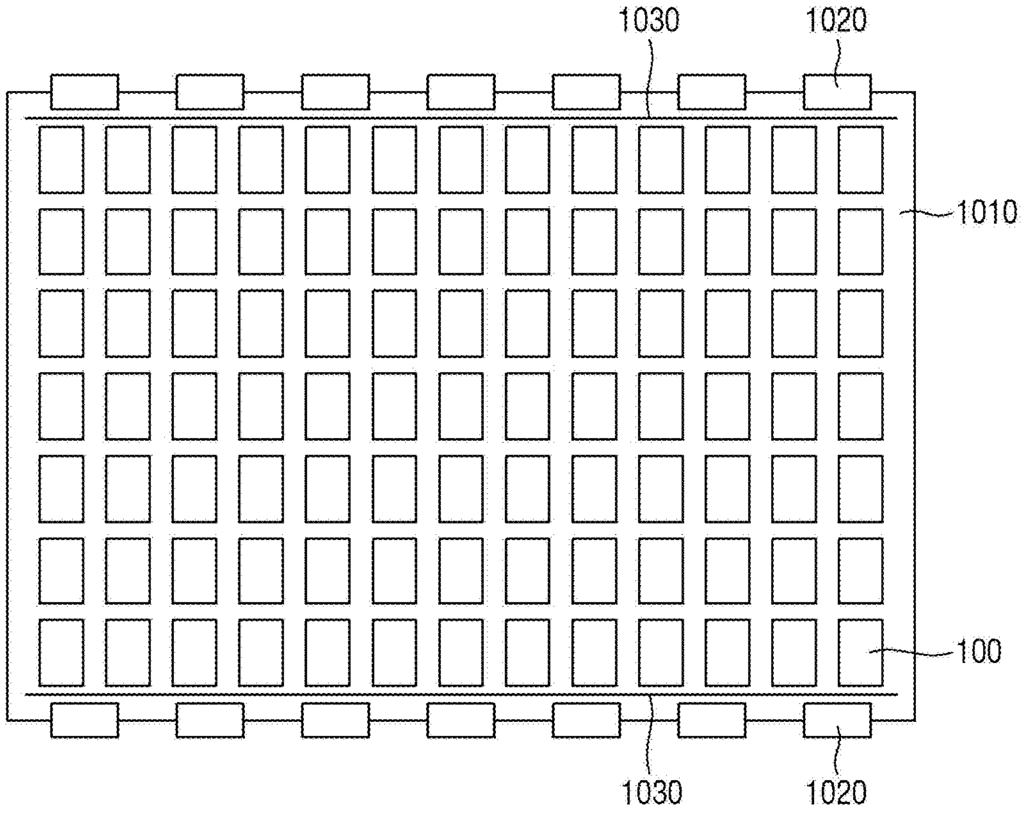
FIG. 10 is a plan view of a mother substrate for manufacturing a display panel according to an embodiment.

FIG. 10 is a plan view of a mother substrate 1010 for manufacturing the display panel 100 according to the embodiment.

Referring to FIG. 10, a plurality of display panels 100 respectively corresponding to the cell areas of the mask substrate are placed on the mother substrate 1010 for manufacturing the display panel 100 according to the embodiment.

The periphery of the mother substrate 1010 is fixed by a plurality of electrostatic chucks 1020 and aligned with a deposition mask during a deposition process. In this case, each of the electrostatic chucks 1020 supports the mother substrate 1010, and the mother substrate 1010 is fixedly attached to the plurality of electrostatic chucks 1020*by* electrostatic force.

In addition to supporting and fixing the mother substrate 1010, the electrostatic chuck 1020 serves as a discharge path for discharging static electricity generated when the mother substrate 1010 and the deposition mask are brought into contact with each other. To this end, main ground lines 1030 are disposed on the periphery of the mother substrate 1010. In this example, one of the main ground lines 1030 is disposed at the top portion of the mother substrate 1010, and the other of the main ground lines 1030 is disposed at the bottom portion of the mother substrate 1010. The main ground lines 1030 allow static electricity input to the mother substrate 1010 to be discharged through the electrostatic chuck 1020 during the deposition process.

Figure 11:
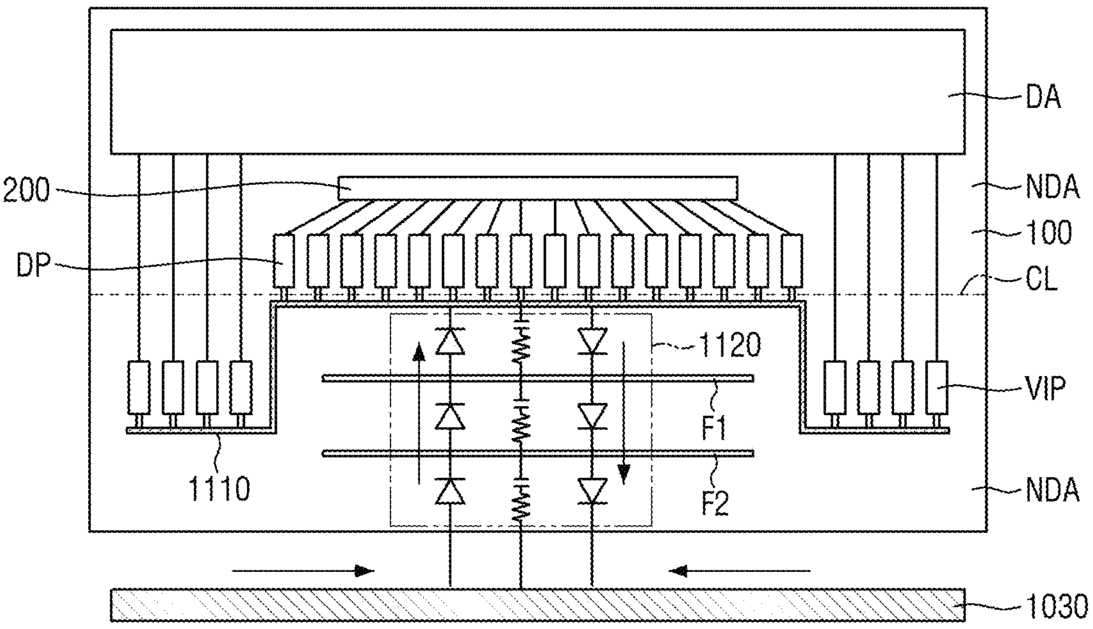
FIG. 11 is a configuration diagram schematically illustrating a peripheral part of the display panel according to the embodiment.

FIG. 11 is a configuration diagram schematically illustrating a peripheral part of the display panel 100 according to the embodiment. A line 1030 illustrated in FIG. 11 is a main ground line 1030 of the mother substrate 1010 described with reference to FIG. 10.

Referring to FIG. 11, the main ground line 1030 of the mother substrate 1010 is connected to an electrostatic protection circuit 1120 disposed in the non-display area NDA of each display panel 100. The electrostatic protection circuit 1120 blocks static electricity generated in the main ground line 1030 of the mother substrate 1010 from being input to each display panel 100. In addition, the electrostatic protection circuit 1120 discharges static electricity generated inside each display panel 100 through the main ground line 1030 of the mother substrate 1010.

According to an embodiment, the electrostatic protection circuit 1120 includes a plurality of floating lines F1 and F2 to lower the voltage level of generated static electricity. The floating lines F1 and F2 are connected to diodes, resistors, and capacitors included in the electrostatic protection circuit 1120.

According to an embodiment, the electrostatic protection circuit 1120 is disposed in the non-display area NDA of the display panel 100 and interposed between the main ground line 1030 of the mother substrate 1010 and a common ground line 1110 disposed in the non-display area NDA of the display panel 100. For example, one end of the electrostatic protection circuit 1120 is connected to the main ground line 1030, and the other end of the electrostatic protection circuit 1120 is connected to the common ground line 1110.

The common ground line 1110 is a ground line commonly connected to a plurality of pads of the display panel 100. For example, the pads include display pad units DP connected to a circuit board (e.g., FPCB) and test pad units VIP for a lighting test of the display area DA. The display pad units DP and the test pad units VIP are electrically connected by the common ground line 1110, and the common ground line 1110 is connected to the electrostatic protection circuit 1120. In this case, the display pad units DP are disposed in the middle of the common ground line 1110, and the test pad units VIP are disposed both ends of the common ground line 1110. Accordingly, the display pad units DP and the test pad units VIP are connected to the electrostatic protection circuit 1120 through the common ground line 1110.

The test pad units VIP and the common ground line 1110 may be removed after the process of manufacturing the display panel 100. For example, in FIG. 11, "CL" represents a virtual cutting line CL for separating each display panel 100 from the mother substrate 1010. Therefore, after the display panel 100 is shipped to a customer, the test pad units VIP among the pads DP and VIP are removed, and the common ground line 1110 and the display pad units DP are disconnected from each other.

Figure 12:
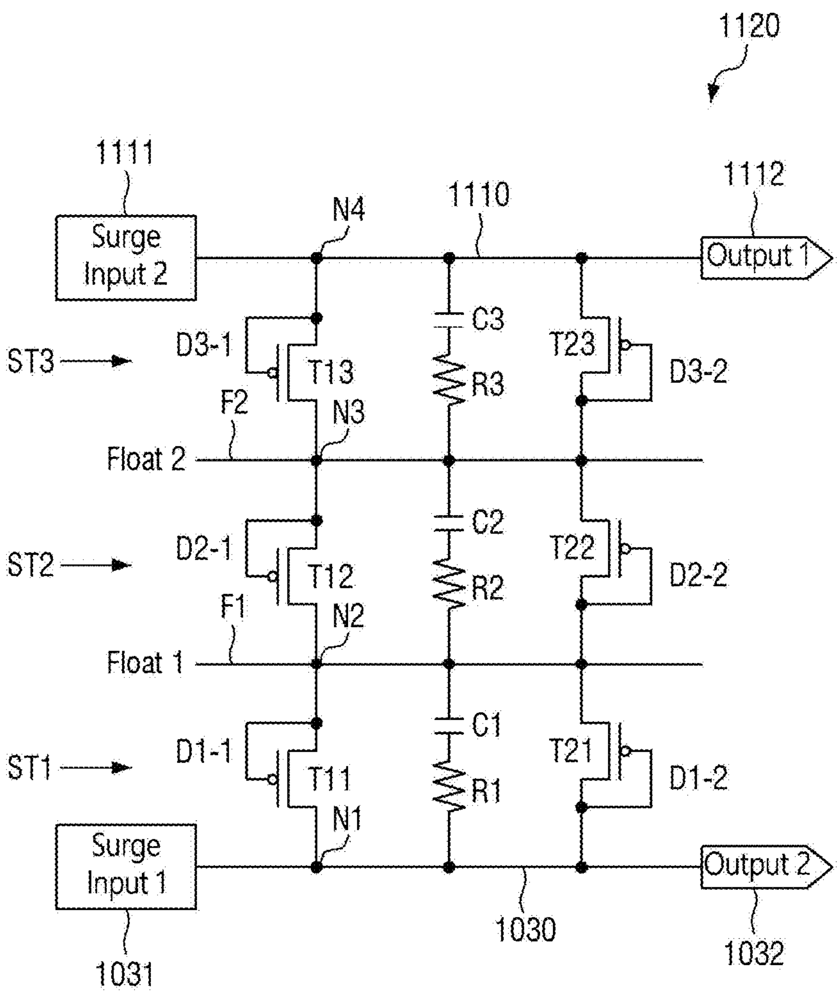
FIG. 12 is a circuit diagram of an electrostatic protection circuit according to an embodiment.
Figure 13:
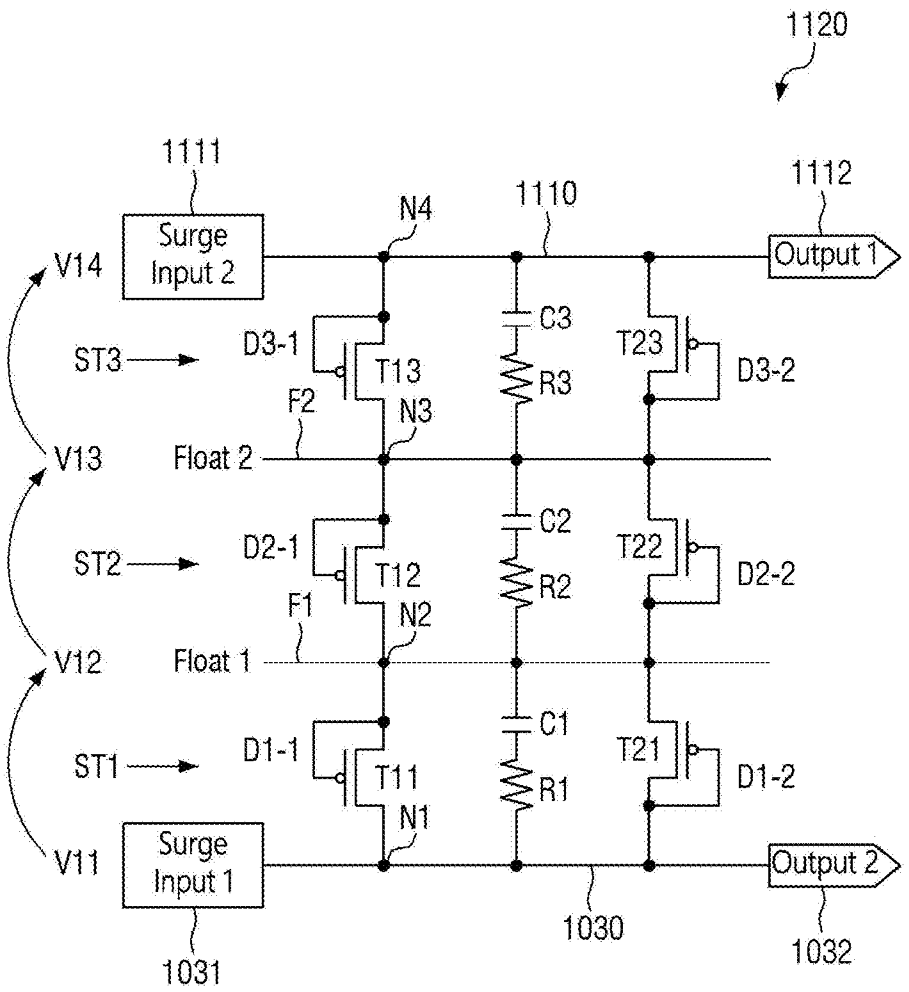
FIGS. 13 and 14 are diagrams for explaining the operation of the electrostatic protection circuit according to the embodiment.
Figure 14:
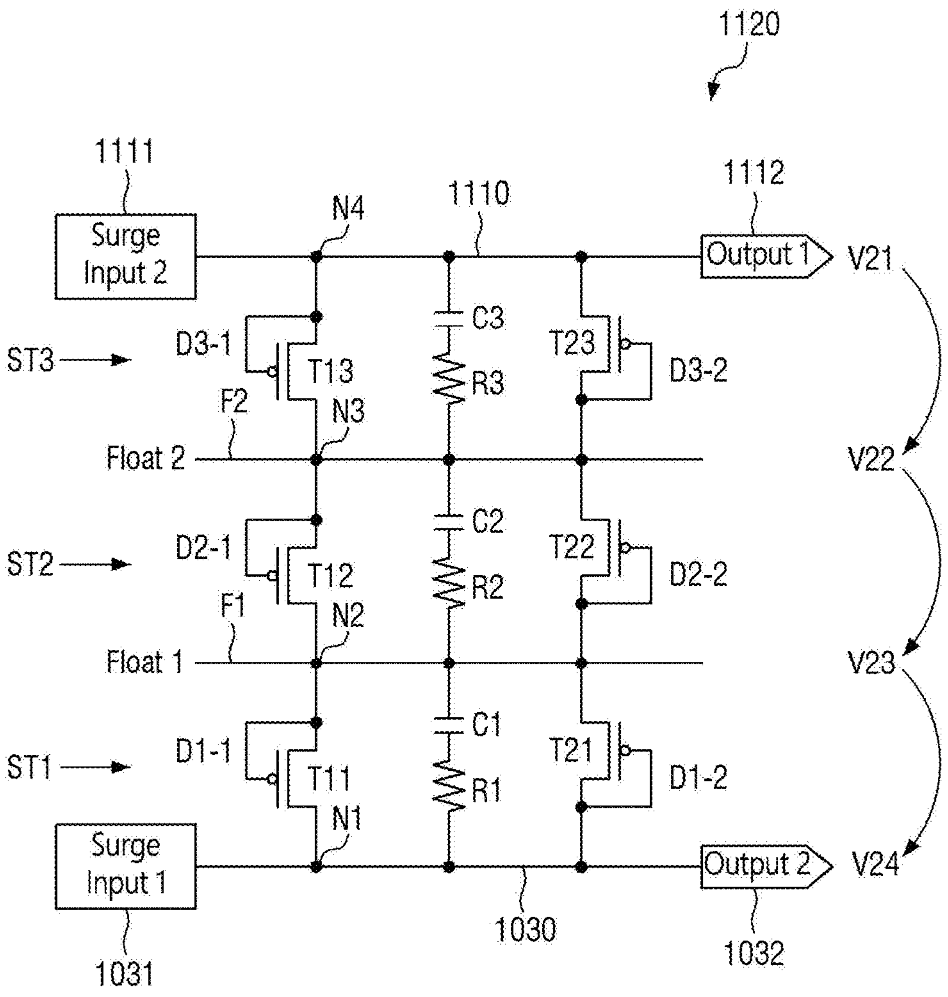

The electrostatic protection circuit 1120 according to an embodiment of the present disclosure are described in more detail with references to FIGS. 12, 13, and 14.

FIG. 12 is a circuit diagram of an electrostatic protection circuit 1120 according to an embodiment. FIGS. 13 and 14 are diagrams for explaining the operation of the electrostatic protection circuit 1120 according to the embodiment.

Referring to FIGS. 12, 13, and 14, the electrostatic protection circuit 1120 according to the embodiment includes a first stage circuit ST1, a second stage circuit ST2, and a third stage circuit ST3. However, this is only an example, and the present disclosure is not limited thereto. For example, the electrostatic protection circuit 1120 may include less or more than three stage circuits. In this case, the electrostatic protection circuit 1120 can bring about a greater voltage drop effect for static electricity.

As depicted in FIG. 12, the first stage circuit ST1 includes a (1-1)$^{th}$ diode D1-1 which causes a forward current to flow from a first node N1 to a second node N2 to which a first floating line F1 is connected and includes a first capacitor C1 and a first resistor R1 connected in series with the first capacitor C1. The first capacitor C1 and the first resistor R1 are connected in parallel to the (1-1)$^{th}$ diode D1-1.

The second stage circuit ST2 includes a (2-1)$^{th}$ diode D2-1 which causes a forward current to flow from the second node N2 to a third node N3 to which a second floating line F2 is connected and includes a second capacitor C2 and a second resistor R2 connected in series with the second capacitor C2. The second capacitor C2 and the second resistor R2 are connected in parallel to the (2-1)$^{th}$ diode D2-1.

The third stage circuit ST3 includes a (3-1)$^{th}$ diode D3-1 which causes a forward current to flow from the third node N3 to a fourth node N4 and includes a third capacitor C3 and a third resistor R3 connected in series with the third capacitor C3. The third capacitor C3 and the third resistor R3 are connected in parallel to the (3-1)$^{th}$ diode D3-1.

The first node N1 is connected to a main ground line 1030 of the mother substrate 1010 for manufacturing the display panel 100. The fourth node N4 is connected to the common ground line 1110 which is commonly connected to a plurality of pads.

The (1-1)$^{th}$ diode D1-1, the (2-1)$^{th}$ diode D2-1, and the (3-1)$^{th}$ diode D3-1 include thin-film transistors T11, T12, and T13, respectively. In this example, the (1-1)$^{th}$ diode D1-1, the (2-1)$^{th}$ diode D2-1, and the (3-1)$^{th}$ diode D3-1 are P-type transistors T11, T12, and T13, respectively. However, the present disclosure is not limited thereto. In another example, the (1-1)th diode D1-1, the (2-1)th diode D2-1, and the (3-1)th diode D3-1 are N-type transistors T11, T12, and T13, respectively.

Referring to FIG. 13, external static electricity 1031 (i.e., surge input 1) generated outside of the display panel 100 input to the first node N1 experiences a voltage drop as it sequentially passes through the first through third stage circuits ST1 through ST3 and then is discharged (1112) through the fourth node N4.

The external static electricity 1031 may be input to the electrostatic protection circuit 1120 through a portion of the main ground line 1030 of the mother substrate 1010. The external static electricity 1031 initially input to the electrostatic protection circuit 1120 experiences a voltage drop as it sequentially passes through the $(1\text{-}1)^{th}$ diode D1-1 the $(2\text{-}1)^{th}$ diode D2-1 and the $(3\text{-}1)^{th}$ diode D3-1 and then is discharged (1112) through the fourth node N4. For example, if the voltage level of the external static electricity 1031 initially input to the electrostatic protection circuit 1120 is V11, it may become V12, which is lower than V11, in the first floating line F1 after passing through the $(1\text{-}1)^{th}$ diode D1-1. In addition, the static electricity that has dropped to the voltage level of V12 in the first floating line F1 may become a voltage level of V13, which is lower than V12, in the second floating line F2 after passing through the $(2\text{-}1)^{th}$ diode D2-1. In addition, the static electricity that has dropped to the voltage of V13 in the second floating line F2 may become a voltage level of V14, which is lower than V13, at the fourth node N4 after passing through the $(3\text{-}1)^{th}$ diode D3-1. Accordingly, the external static electricity 1031 may become a discharged output 1112.

Referring back to FIG. 12, the first stage circuit ST1 further includes a $(1\text{-}2)^{th}$ diode D1-2 which causes a forward current to flow from the second node N2 to the first node N1. The second stage circuit ST2 further includes a $(2\text{-}2)^{th}$ diode D2-2 which causes a forward current to flow from the third node N3 to the second node N2. The third stage circuit ST3 further includes a $(3\text{-}2)^{th}$ diode D3-2 which causes a forward current to flow from the fourth node N4 to the third node N3. The first capacitor and the first resistor are connected in parallel to the (1-2)-th diode, the second capacitor and the second resistor are connected in parallel to the (2-2)-th diode, and the third capacitor and the third resistor are connected in parallel to the (3-2)-th diode.

The $(1\text{-}2)^{th}$ diode D1-2, the $(2\text{-}2)^{th}$ diode D2-2, and the $(3\text{-}2)^{th}$ diode D3-2 include thin-film transistors T21, T22, and T23, respectively. In this example, the $(1\text{-}2)^{th}$ diode D1-2, the $(2\text{-}2)^{th}$ diode D2-2, and the $(3\text{-}2)^{th}$ diode D3-2 are P-type transistors T21, T22, and T23, respectively. However, the present disclosure is not limited thereto. In another example, the (1-2)th diode D1-2, the (2-2)th diode D2-2, and the (3-2)th diode D3-2 are N-type transistors T21, T22, and T23, respectively.

Referring to FIG. 14, internal static electricity 1111 (i.e., surge input 2) input to the fourth node N4 experiences a voltage drop as it sequentially passes through the third stage circuit ST3, the second stage circuit ST2 and the first stage circuit ST1 and then is discharged (1032) through the first node N1.

The internal static electricity 1111 may be generated inside the display panel 100, which is different from the external static electricity 1031, may be input to the electrostatic protection circuit 1120 through a portion of a common ground line 1110. The internal static electricity 1111 initially input to the electrostatic protection circuit 1120 experiences a voltage drop as it sequentially passes through the $(3\text{-}2)^{th}$ diode D3-2, the $(2\text{-}2)^{th}$ diode D2-2 and the $(1\text{-}2)^{th}$ diode D1-2 and then is discharged (1032) through the first node N1. For example, if the voltage level of the internal static electricity 1111 initially input to the electrostatic protection circuit 1120 is V21, it may become V22, which is lower than V21, in the second floating line F2 after passing through the $(3\text{-}2)^{th}$ diode D3-2. In addition, the static electricity that has dropped to the voltage level of V22 in the second floating line F2 may become a voltage level of V23, which is lower than V22, in the first floating line F1 after passing through the $(2\text{-}2)^{th}$ diode D2-2. In addition, the static electricity that has dropped to the voltage of V23 in the first floating line F1 may become a voltage level of V24, which is lower than V23, at the first node N1 after passing through the $(1\text{-}2)^{th}$ diode D1-2. Accordingly, the internal static electricity 1111 may become a discharged output 1032.

The fourth node N4 is a node connected to the common ground line 1110 which is commonly connected to a plurality of the display pad units DP and the test pad units VIP in the non-display area NDA. The display pad units DP may be connected to a circuit board, and the test pad units VIP is for a lighting test of a display area. As described above, after the display panel 100 is shipped to a customer, the test pad units VIP among the pads DP and VIP are removed, and the common ground line 1110 and the display pad units DP are disconnected from each other.

In a display device and a mobile electronic device including the same according to embodiments, it is possible to protect the inside of a display panel 100 from the static electricity of a main ground line 1030 disposed on the periphery of a mother substrate 1010 and possible to easily discharge static electricity generated inside the display panel 100 to the periphery of the mother substrate 1010.

In a display device and a mobile electronic device including the same according to embodiments, it is possible to protect the inside of a display panel from the static electricity of a ground line disposed on the periphery of a mother substrate and possible to easily discharge static electricity generated inside the display panel to the periphery of the mother substrate.

However, the effects of the present disclosure are not restricted to the one set forth herein. The above and other effects of the present disclosure will become more apparent to one of daily skill in the art to which the present disclosure pertains by referencing the claims.

In concluding the detailed description, those skilled in the art will appreciate that many variations and modifications can be made to the preferred embodiments without substantially departing from the principles of the present disclosure. Therefore, the disclosed preferred embodiments of the disclosure are used in a generic and descriptive sense only and not for purposes of limitation.

What is claimed is:

1. A display device comprising:
   - a display panel which includes a display area and a non-display area and includes an electrostatic protection circuit which is disposed in the non-display area, wherein the electrostatic protection circuit includes:
   - a first stage circuit having a (1-1)-th diode which causes a forward current to flow from a first node to a second node to which a first floating line is connected and a first capacitor and a first resistor which are connected in parallel to the (1-1)-th diode;
   - a second stage circuit having a (2-1)-th diode which causes a forward current to flow from the second node to a third node to which a second floating line is connected and a second capacitor and a second resistor which are connected in parallel to the (2-1)-th diode; and a third stage circuit having a (3-1)-th diode which causes a forward current to flow from the third node to a fourth node and a third capacitor and a third resistor which are connected in parallel to the (3-1)-th diode, wherein:

the first capacitor and the first resistor are connected in series, and a combination of the first capacitor and the first resistor are connected in parallel to the (1-1)-th diode.

2. The display device of claim 1, wherein the first node is connected to a main ground line of a mother substrate which is provided for manufacturing the display panel.

3. The display device of claim 1, wherein each of the (1-1)-th diode, the (2-1)-th diode, and the (3-1)-th diode includes a thin-film transistor.

4. The display device of claim 1, wherein static electricity input to the first node experiences a voltage drop as the static electricity sequentially passes through the first, second, and third stage circuits, and then is discharged through the fourth node.

5. The display device of claim 4, wherein the first stage circuit further includes a (1-2)-th diode which causes a forward current to flow from the second node to the first node, the second stage circuit further includes a (2-2)-th diode which causes a forward current to flow from the third node to the second node, and the third stage circuit further includes a (3-2)-th diode which causes a forward current to flow from the fourth node to the third node, and wherein the first capacitor and the first resistor are connected in parallel to the (1-2)-th diode, the second capacitor and the second resistor are connected in parallel to the (2-2)-th diode, and the third capacitor and the third resistor are connected in parallel to the (3-2)-th diode.

6. The display device of claim 5, wherein each of the (1-2)-th diode, the (2-2)-th diode, and the (3-2)-th diode includes a thin-film transistor.

7. The display device of claim 5, wherein static electricity input to the fourth node experiences a voltage drop as the static electricity sequentially passes through the third, second, and first stage circuits, and then is discharged through the first node.

8. The display device of claim 7, wherein the fourth node is connected to a common ground line which is commonly connected to a plurality of pads in the non-display area.

9. The display device of claim 8, wherein the pads include display pad units connected to a circuit board through the common ground line.

10. The display device of claim 8, wherein the pads include test pad units for a lighting test of the display area.

11. A mobile electronic device comprising:

a display panel which includes a display area and a non-display area and includes an electrostatic protection circuit disposed in the non-display area, wherein the electrostatic protection circuit includes:

a first stage circuit having a (1-1)-th diode which causes a forward current to flow from a first node to a second node to which a first floating line is connected and a first capacitor and a first resistor which are connected in parallel to the (1-1)-th diode;

a second stage circuit having a (2-1)-th diode which causes a forward current to flow from the second node to a third node to which a second floating line is connected and a second capacitor and a second resistor which are connected in parallel to the (2-1)-th diode; and a third stage circuit having a (3-1)-th diode which causes a forward current to flow from the third node to a fourth node and a third capacitor and a third resistor which are connected in parallel to the (3-1)-th diode, wherein:

the first capacitor and the first resistor are connected in series, and a combination of the first capacitor and the first resistor are connected in parallel to the (1-1)-th diode.

12. The mobile electronic device of claim 11, wherein the first node is connected to a main ground line of a mother substrate which is provided for manufacturing the display panel.

13. The mobile electronic device of claim 11, wherein each of the (1-1)-th diode, the (2-1)-th diode, and the (3-1)-th diode includes a thin-film transistor.

14. The mobile electronic device of claim 11, wherein static electricity input to the first node experiences a voltage drop as the static electricity sequentially passes through the first, second, and third stage circuits, and then is discharged through the fourth node.

15. The mobile electronic device of claim 14, wherein the first stage circuit further includes a (1-2)-th diode which causes a forward current to flow from the second node to the first node, the second stage circuit further includes a (2-2)-th diode which causes a forward current to flow from the third node to the second node, and the third stage circuit further includes a (3-2)-th diode which causes a forward current to flow from the fourth node to the third node, and wherein the first capacitor and the first resistor are connected in parallel to the (1-2)-th diode, the second capacitor and the second resistor are connected in parallel to the (2-2)-th diode, and the third capacitor and the third resistor are connected in parallel to the (3-2)-th diode.

16. The mobile electronic device of claim 15, wherein each of the (1-2)-th diode, the (2-2)-th diode, and the (3-2)-th diode includes a thin-film transistor.

17. The mobile electronic device of claim 15, wherein static electricity input to the fourth node experiences a voltage drop as the static electricity sequentially passes through the third, second, and the first stage circuits, and then is discharged through the first node.

18. The mobile electronic device of claim 17, wherein the fourth node is connected to a common ground line which is commonly connected to a plurality of pads in the non-display area.

19. The mobile electronic device of claim 18, wherein the pads comprise display pad units connected to a circuit board and test pad units for a lighting test of the display area.

20. A display device comprising:

a display panel which includes a display area and a non-display area;

a display driver configured to generate data signals and voltages for driving the display panel; and an electrostatic protection circuit which is disposed in the non-display area of the display panel, wherein one end of the electrostatic protection circuit is connected to the display driver through a common ground line, and an other end of the electrostatic protection circuit is connected to a main ground line of a mother substrate which is provided for manufacturing the display panel, wherein the electrostatic protection circuit includes:

a first stage circuit having a (1-1)-th diode which causes a forward current to flow from a first node to a second node to which a first floating line is connected and a first capacitor and a first resistor which are connected in parallel to the (1-1)-th diode;

a second stage circuit having a (2-1)-th diode which causes a forward current to flow from the second node to a third node to which a second floating line is connected and a second capacitor and a second resistor which are connected in parallel to the (2-1)-th diode; and a third stage circuit having a (3-1)-th diode which causes a forward current to flow from the third node to a fourth node and a third capacitor and a third resistor which are connected in parallel to the (3-1)-th diode, and wherein the first node is connected to the main ground line, and the fourth node is connected to the common ground line, and wherein the fourth node is connected to the common ground line which is commonly connected to a plurality of pads in the non-display area.

* * * * *